United States Patent
Oda

(10) Patent No.: US 11,495,935 B2
(45) Date of Patent: Nov. 8, 2022

(54) OPTICAL FILTER, AND LASER LIGHT SOURCE AND OPTICAL TRANSCEIVER USING THE SAME

(71) Applicant: DENSO CORPORATION, Kariya (JP)

(72) Inventor: Toshihiro Oda, Kariya (JP)

(73) Assignee: DENSO CORPORATION, Kariya (JP)

( * ) Notice: Subject to any disclaimer, the term of this patent is extended or adjusted under 35 U.S.C. 154(b) by 419 days.

(21) Appl. No.: 16/665,704

(22) Filed: Oct. 28, 2019

(65) Prior Publication Data
US 2020/0144782 A1    May 7, 2020

(30) Foreign Application Priority Data
Nov. 2, 2018   (JP) .............................. JP2018-207488

(51) Int. Cl.
| | |
|---|---|
| *H01S 3/08* | (2006.01) |
| *H01S 5/14* | (2006.01) |
| *H04B 10/50* | (2013.01) |
| *H04B 10/40* | (2013.01) |

(52) U.S. Cl.
CPC ......... *H01S 3/08027* (2013.01); *H04B 10/40* (2013.01); *H04B 10/503* (2013.01)

(58) Field of Classification Search
CPC ............. H01S 3/08027; H01S 3/08059; H01S 5/0287; H01S 5/142; H01S 5/101; H01S 5/10; H01S 5/1071; H04B 10/40; H04B 10/503

See application file for complete search history.

(56) References Cited

U.S. PATENT DOCUMENTS

| | | | |
|---|---|---|---|
| 6,504,971 B1 | 1/2003 | Margalit et al. | |
| 6,668,006 B1 | 12/2003 | Margalit et al. | |
| 9,608,406 B1 | 3/2017 | Lee et al. | |
| 2006/0153267 A1* | 7/2006 | Suzuki ................... | H01S 5/142 372/92 |
| 2006/0198415 A1 | 9/2006 | Yamazaki | |
| 2006/0198416 A1 | 9/2006 | Yamazaki | |
| 2006/0222038 A1 | 10/2006 | Yamazaki | |
| 2006/0222039 A1 | 10/2006 | Yamazaki | |
| 2008/0056311 A1 | 3/2008 | Takeuchi et al. | |

(Continued)

FOREIGN PATENT DOCUMENTS

| | | |
|---|---|---|
| JP | S62-100706 A | 5/1987 |
| JP | S63-281104 A | 11/1988 |

(Continued)

*Primary Examiner* — Xinning(Tom) Niu
(74) *Attorney, Agent, or Firm* — Posz Law Group, PLC

(57) ABSTRACT

An optical filter includes a first ring resonator a second ring resonator having different perimeters, and a waveguide optically coupled to the first ring resonator and transmit light to the first ring resonator. Light incident on the waveguide is transmitted to the second ring resonator through the first ring resonator. A free spectral range of a transmission spectrum of the first ring resonator and a free spectral range of a transmission spectrum of the second ring resonator are staggered to each other, and are set so that a transmission spectrum of a double ring corresponding to a synthetic spectrum of the transmission spectrum of the first ring resonator and the transmission spectrum of the second ring resonator has a highest first peak at an arbitrary wavelength.

15 Claims, 24 Drawing Sheets

(56) References Cited

U.S. PATENT DOCUMENTS

| | | | |
|---|---|---|---|
| 2008/0056313 A1* | 3/2008 | Yamazaki | H04B 10/504 372/28 |
| 2008/0187268 A1 | 8/2008 | Kaneko et al. | |
| 2008/0192373 A1 | 8/2008 | Tomita et al. | |
| 2008/0232409 A1 | 9/2008 | Yamazaki | |
| 2008/0240646 A1 | 10/2008 | Yamazaki | |
| 2008/0259437 A1 | 10/2008 | Suzuki | |
| 2009/0010592 A1 | 1/2009 | Yamazaki | |
| 2009/0046748 A1* | 2/2009 | Kato | H01S 5/141 372/20 |
| 2009/0059973 A1 | 3/2009 | Suzuki | |
| 2009/0122817 A1* | 5/2009 | Sato | G02B 6/12007 372/20 |
| 2009/0285251 A1* | 11/2009 | Yamazaki | H01S 5/141 372/29.014 |
| 2010/0246612 A1 | 9/2010 | Shimizu | |
| 2010/0284649 A1 | 11/2010 | Ishii | |
| 2011/0013654 A1 | 1/2011 | Yamazaki | |
| 2011/0135251 A1 | 6/2011 | Kato | |
| 2016/0156149 A1* | 6/2016 | Takabayashi | H01S 5/142 372/6 |
| 2017/0098921 A1 | 4/2017 | Takabayashi et al. | |
| 2017/0179671 A1 | 6/2017 | Takabayashi et al. | |
| 2017/0353001 A1* | 12/2017 | Takabayashi | H01S 5/1007 |

FOREIGN PATENT DOCUMENTS

| | | |
|---|---|---|
| JP | H03-054529 A | 3/1991 |
| JP | H05-323391 A | 12/1993 |
| JP | H10-261837 A | 9/1998 |
| JP | 2004-279982 A | 10/2004 |
| JP | 2005-242141 A | 9/2005 |
| JP | 2007-115900 A | 5/2007 |
| JP | 2008-066318 A | 3/2008 |
| JP | 2009-010197 A | 1/2009 |
| JP | 2010-027664 A | 2/2010 |
| JP | 2010-087472 A | 4/2010 |
| JP | 2010-177539 A | 8/2010 |
| JP | 2011-075767 A | 4/2011 |
| JP | 2011-142191 A | 7/2011 |
| JP | 2011-171355 A | 9/2011 |
| JP | 2013-093627 A | 5/2013 |
| JP | 2015-109303 A | 6/2015 |
| JP | 2015-154052 A | 8/2015 |
| JP | 2016-212265 A | 12/2016 |
| JP | 2017-098362 A | 6/2017 |
| JP | 2018-141821 A | 9/2018 |

* cited by examiner

| PARAMETER | VALUE |
|---|---|
| Lring1 | 132.91 μm |
| Lring2 | 162.52 μm |
| Lc1 | 3.58 μm |
| Lc2 | 4.56 μm |
| κ1 | 0.217 |
| κ2 | 0.268 |

| CONDITION | RELATIVE TEMPERATURE | PEAKS (1), (3) | PEAK (2) |
|---|---|---|---|
| a1 | 0°C | FIRST PEAK | SECOND PEAK |
| a2 | +2.7°C | FIRST PEAK | FIRST PEAK |
| a3 | +5.4°C | SECOND PEAK | FIRST PEAK |

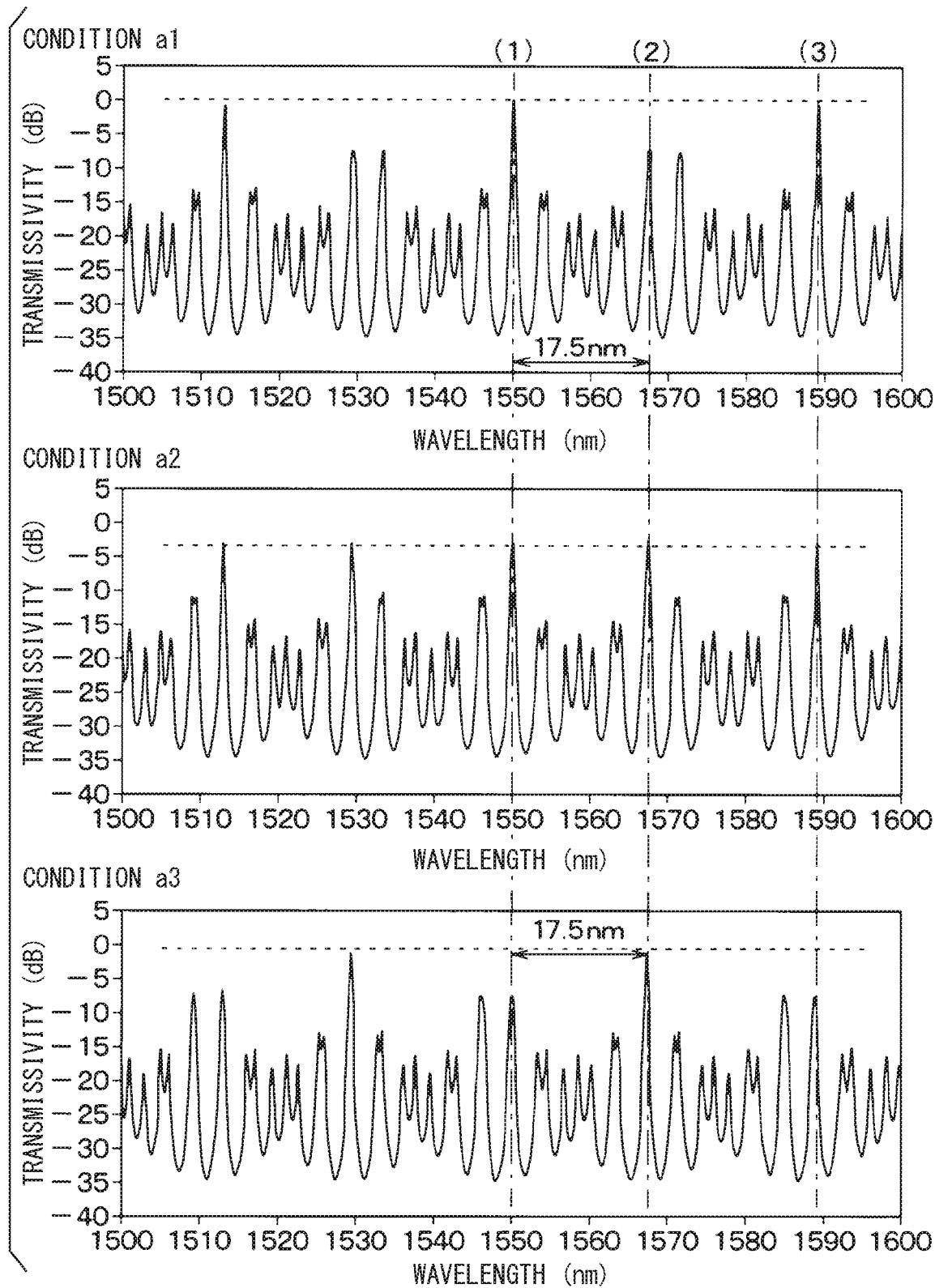

FIG. 12A

| PARAMETER | VALUE |
|---|---|
| Lring1 | 151.33 μm |
| Lring2 | 165.15 μm |
| Lc1 | 4.09 μm |
| Lc2 | 4.09 μm |
| $\kappa 1$ | 0.243 |
| $\kappa 2$ | 0.243 |

FIG. 12B

| CONDITION | RELATIVE TEMPERATURE | PEAKS (1), (3) | PEAK (2) |
|---|---|---|---|
| b1 | 0°C | FIRST PEAK | SECOND PEAK |
| b2 | +2.2°C | FIRST PEAK | FIRST PEAK |
| b3 | +4.3°C | SECOND PEAK | FIRST PEAK |

FIG. 14A

| PARAMETER | VALUE |
|---|---|
| $Lring1$ | 134.22 μm |
| $Lring2$ | 164.49 μm |
| $Lc1$ | 3.58 μm |
| $Lc2$ | 4.56 μm |
| $\kappa 1$ | 0.217 |
| $\kappa 2$ | 0.268 |

FIG. 14B

| CONDITION | RELATIVE TEMPERATURE | GAIN DIFFERENCE X | TRANSMISSIVITY DIFFERENCE Y | GAIN DIFFERENCE X + TRANSMISSIVITY DIFFERENCE Y |
|---|---|---|---|---|
| c1 | 0°C | 2.0dB | 6.0dB | 8.0dB |
| c2 | +2.0°C | 2.0dB | 1.0dB | 3.0dB |

FIG. 16A

| PARAMETER | VALUE |
|---|---|
| Lring1 | 134.88 μm |
| Lring2 | 164.49 μm |
| Lc1 | 3.58 μm |
| Lc2 | 4.56 μm |
| $\kappa 1$ | 0.217 |
| $\kappa 2$ | 0.268 |

FIG. 16B

| CONDITION | RELATIVE TEMPERATURE | GAIN DIFFERENCE X | TRANSMISSIVITY DIFFERENCE Y | GAIN DIFFERENCE X + TRANSMISSIVITY DIFFERENCE Y |
|---|---|---|---|---|
| d1 | 0°C | 3.0dB | 6.0dB | 9.0dB |
| d2 | +2.3°C | 3.0dB | 0.0dB | 3.0dB |

FIG. 18A

| PARAMETER | VALUE |
|---|---|
| Lring1 | 151.33 μm |
| Lring2 | 165.14 μm |
| Lc1 | 4.09 μm |
| Lc2 | 4.09 μm |
| $\kappa 1$ | 0.243 |
| $\kappa 2$ | 0.243 |

FIG. 18B

| CONDITION | RELATIVE TEMPERATURE | GAIN DIFFERENCE X | TRANSMISSIVITY DIFFERENCE Y | GAIN DIFFERENCE X + TRANSMISSIVITY DIFFERENCE Y |
|---|---|---|---|---|
| e1 | 0°C | 0.0dB | 6.0dB | 6.0dB |
| e2 | +1.2°C | 0.0dB | 3.0dB | 3.0dB |

OPTICAL FILTER, AND LASER LIGHT SOURCE AND OPTICAL TRANSCEIVER USING THE SAME

CROSS REFERENCE TO RELATED APPLICATIONS

This application is based on Japanese Patent Application No. 2018-207488 filed on Nov. 2, 2018, the disclosure of which is incorporated herein by reference.

TECHNICAL FIELD

The present disclosure relates to a wavelength variable optical filter using a ring resonator, and a laser light source and an optical transceiver using the optical filter.

BACKGROUND

A wavelength variable optical filter may be provided with two ring resonators disposed on a semiconductor substrate, and a laser light source may be provided with the optical filters.

SUMMARY

The present disclosure describes a wavelength variable optical filter using a ring resonator, and a laser light source and an optical transceiver using the optical filter.

BRIEF DESCRIPTION OF DRAWINGS

The above and other objects, features and advantages of the present disclosure will become more apparent from the following detailed description made with reference to the accompanying drawings.

FIG. 11 is a waveform chart of a transmission spectrum of a double ring in each of the conditions a1 to a3.

FIG. 12A is a table showing values of parameters of an optical filter according to a first comparative example.

FIG. 12B is a table showing peak positions in each of conditions b1 to b3.

FIG. 14A is a table showing values of parameters of a laser light source according to a second example.

FIG. 14B is a table showing peak positions in each of conditions c1 to c2.

FIG. 16A is a table showing values of parameters of a laser light source according to a third example.

FIG. 16B is a table showing peak positions in each of conditions d1 to d2.

FIG. 18A is a table showing values of parameters of a laser light source according to a second comparative example.

FIG. 18B is a table showing peak positions in each of conditions e1 to e2.

DETAILED DESCRIPTION

Figure 1:
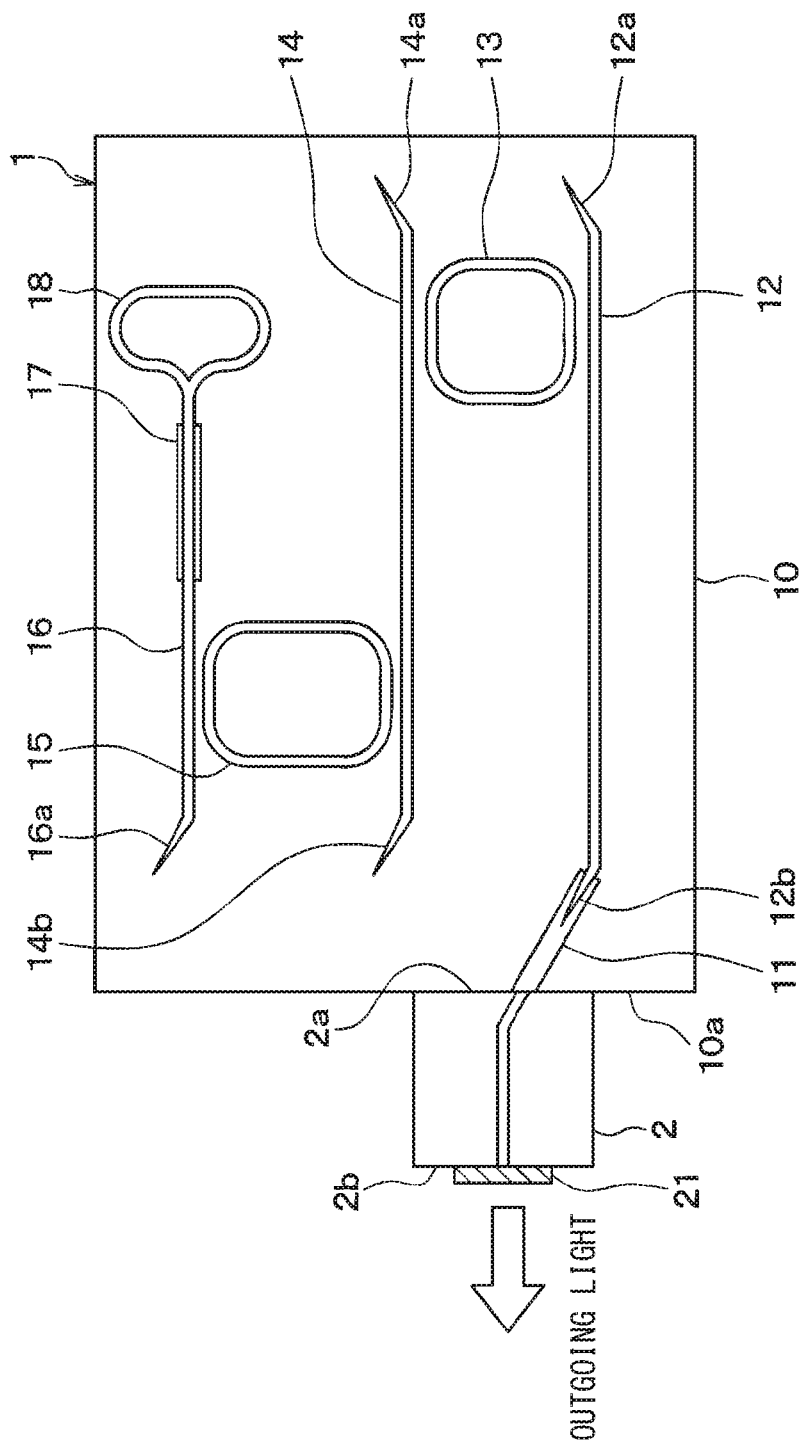
FIG. 1 is a diagram illustrating a schematic configuration of a laser light source according to a first embodiment.

A laser light source including an optical filter may have a configuration in which, when outgoing light from a semiconductor optical amplifier (referred to as a "SOA") is transmitted through a waveguide, the outgoing light is input to two ring resonators, and then reflected by a loop mirror on the end so as to be returned to the SOA. The dimensions of the respective ring resonators are made slightly different from each other so that free spectral ranges (referred to as "FSRs") of transmission spectrums of the respective ring resonators obtained when outgoing light is input become slightly different from each other. Accordingly, strong resonance occurs when wavelengths of peaks of the transmission spectrums of the two ring resonators overlap. A strong resonance state is created between a reflecting mirror on the end face of the SOA and the loop mirror using a Vernier effect of the two ring resonators. Accordingly, a transmission spectrum of a double ring corresponding to a synthetic spectrum of the transmission spectrums of the two ring resonators has a highest peak at a wavelength where strong resonance occurs, and strong light laser-oscillated at this wavelength can be output from the reflecting mirror on the end face of the SOA. Outgoing light from the SOA toward the waveguide is referred to as internal outgoing light. Light output from the SOA to the outside is referred to as external outgoing light.

A laser light source including such an optical filter may have an undesirable situation that a mode hop occurs when temperature difference between the two ring resonators changes. The mode hop is a phenomenon caused by a shift of a wavelength of a longitudinal mode selected by the two ring resonators from an original wavelength due to a change in the temperature difference between the two ring resonators.

In order to improve the wavelength variability, two ring resonators having close FSRs are used. A mode hop in which the longitudinal mode selected by the two ring resonators changes occurs. The transmission spectrum of the double ring has the highest peak at a wavelength where strong resonance occurs, and also has the second highest peak at wavelengths adjacent, on both sides, to the wavelength where strong resonance occurs. When the temperature difference between the two ring resonators changes, a mode hop likely occur. In the laser light source provided with the SOA, when the second highest peak rises due to a change in the temperature difference between the two ring resonators, oscillation likely occur at the second highest peak, and the wavelength of external outgoing light is shifted.

Heat is transferred to each ring resonator by the SOA serving as a heat source. A way of the heat transfer varies, which causes a change in the temperature difference between the ring resonators. Each ring resonator is provided with a heater. A temperature control by the heater can be performed. It may be difficult to prevent a mode hop. Even if oscillation occurs at the second highest peak, since the wavelength of the second highest peak is close to the wavelength of the highest peak, such a state may not be detected by a control unit or the like.

In view of this situation, a mode hop may be prevented by using a configuration provided with a control ring. Specifically, a control ring may be provided in addition to two ring resonators. The quantity of internal outgoing light that has passed through each of the ring resonators and the control ring is detected by a controlling light receiving element, and a heater is adjusted based on a result of the detection to control a resonant wavelength of the internal outgoing light of the control ring, thereby preventing a mode hop.

When a mode hop is prevented using the control ring, the control ring may be required in addition to the two ring resonators. An additional element may be required, which results in a situation such as upsizing of a semiconductor substrate on which an optical filter is formed.

In one or more embodiments of the present disclosure, an optical filter prevents a mode hope without an additional element, and a laser light source and an optical transceiver are provided with the optical filter.

According to an aspect of the present disclosure, an optical filter includes: a first ring resonator and a second ring resonator having different perimeters; and a waveguide optically coupled to the first ring resonator and configured to transmit light to the first ring resonator. The light incident on the waveguide is transmitted to the second ring resonator through the first ring resonator. A free spectral range of a transmission spectrum of the first ring resonator and a free spectral range of a transmission spectrum of the second ring resonator are shifted to each other, and are set such that a transmission spectrum of a double ring, which corresponds to a synthetic spectrum of the transmission spectrum of the first ring resonator and the transmission spectrum of the second ring resonator, has a highest first peak at an arbitrary wavelength. The transmission spectrum of the double ring has a second peak being second highest next to the first peak. The transmission spectrum of the double ring has a peak lower than the second peak, the peak located between the first peak and the second peak.

With this manner, the wavelength of the highest first peak and the wavelength of the second highest second peak are separated from each other. Even if the second peak rises, and the highest first peak is interchanged with the second peak, since the second peak is separated from the wavelength originally having the first peak, it may be possible to relatively easily detect the interchange. Accordingly, it may be possible to prevent a mode hop without an additional element.

Embodiments of the present disclosure are described with reference to the drawings. In the following description, identical reference signs designate identical or equivalent parts throughout the embodiments.

First Embodiment

A first embodiment is described with reference to FIGS. 1 to 8. In the present embodiment, a laser light source using an optical filter is described.

As illustrated in FIG. 1, the laser light source includes an optical filter 1 and a SOA 2. The laser light source emits internal outgoing light from the SOA 2 to the optical filter 1, extracts strong light brought into a resonant state in the optical filter 1 and the SOA 2, and outputs the strong light as external outgoing light to the outside from the SOA 2.

The optical filter 1 is formed, for example, by performing a semiconductor process using a semiconductor substrate 10. Specifically, the semiconductor substrate 10, which is included in the optical filter 1, is provided with an SSC (optical spot size converter) 11, a first waveguide 12, a first ring resonator 13, a second waveguide 14, a second ring resonator 15, a third waveguide 16, a modulator 17, a loop mirror 18, and the like.

The SSC 11 is an optical spot size converter. The SSC 11 is used for adjusting a mode diameter between the SOA 2 and the first waveguide 12 or the second waveguide 14. One end of the SSC 11 is exposed from an end face 10a of the semiconductor substrate 10. The other end of the SSC 11 is connected to the first waveguide 12. For example, the SSC 11 is formed in a tapered shape. The mode diameter is gradually expanded from the first waveguide 12 toward the SOA 2. The other end side of the SSC 11 connected to the first waveguide 12 is inclined by a predetermined angle with respect to the longitudinal direction of the first waveguide 12.

The first waveguide 12, the second waveguide 14, and the third waveguide 16 transmit internal outgoing light of the SOA 2 sent from the SSC 11, have a linear shape having a longitudinal direction aligned with one direction, and are disposed in parallel to each other. The first waveguide 12 transmits internal outgoing light to the first ring resonator 13 and transmits internal outgoing light returned from the first ring resonator 13 toward the SOA 2. The second waveguide 14 transmits internal outgoing light transmitted from the first ring resonator 13 to the second ring resonator 15 and transmits internal outgoing light returned from the second ring resonator 15 toward the first ring resonator 13. Internal outgoing light transmitted from the second ring resonator 15 is returned to the third waveguide 16 through the loop mirror 18. The third waveguide 16 transmits the returned internal outgoing light to the second ring resonator 15 again.

A terminator 12a is disposed on an end of the first waveguide 12, the end being opposite to the SSC 11. Terminators 14a, 14b are disposed on respective ends of the second waveguide 14. A terminator 16a is disposed on an end of the third waveguide 16, the end being opposite to the loop mirror 18. Unnecessary light transmitted through the waveguides is emitted to the outside of the waveguides by the terminators 12a, 14a, 14b, 16a. Each of the terminators 12a, 14a, 14b, 16a extends in a direction inclined by a predetermined angle with respect to the longitudinal direction of the corresponding waveguide and has a tapered shape so as to prevent unnecessary light from being reflected and transmitted to the waveguide again. An end of the first waveguide 12, the end being connected to the SSC 11, also extends in a direction inclined by a predetermined angle with respect to the longitudinal direction of the first waveguide 12. Since the end is connected to the SSC 11 including a waveguide 12b having a tapered shape, light is efficiently transmitted toward the SSC 11 by reducing reflection.

Each of the first ring resonator 13 and the second ring resonator 15 is a resonator that generates a transmission spectrum having a predetermined free spectral range (FSR) by input of internal outgoing light thereto. The first ring resonator 13 and the second ring resonator 15 have different perimeters and generate transmission spectrums having different FSRs. The perimeter of the first ring resonator 13 and the perimeter of the second ring resonator 15 are set in any manner. The longer perimeter is set within the range of substantially 1.1 to 1.5 times the shorter perimeter.

At a wavelength where the transmission spectrums generated by the first ring resonator 13 and the second ring resonator 15 overlap, a transmission spectrum of a double ring corresponding to a synthetic spectrum thereof has the highest first peak. A longitudinal mode of a Fabry-Perot resonator formed between a reflecting mirror 21 and the loop mirror 18 is selected based on the first peak, and strong light is obtained due to laser oscillation. The strong light is output as external outgoing light from the SOA 2 to the outside.

The first ring resonator 13 is disposed between the first waveguide 12 and the second waveguide 14 at a position separated from the first waveguide 12 and the second waveguide 14 by a predetermined distance, but optically coupled to the first waveguide 12 and the second waveguide 14. When internal outgoing light is transmitted from the first waveguide 12, the internal outgoing light is transmitted to the first ring resonator 13 and the light transmitted into the first ring resonator 13 is transmitted to the second waveguide 14.

The second ring resonator 15 is disposed between the second waveguide 14 and the third waveguide 16 at a position separated from the second waveguide 14 and the third waveguide 16 by a predetermined distance, but optically coupled to the second waveguide 14 and the third waveguide 16. When internal outgoing light is transmitted from the second waveguide 14, the internal outgoing light is transmitted to the second ring resonator 15, and the light transmitted into the second ring resonator 15 is transmitted to the third waveguide 16.

Figure 2A:
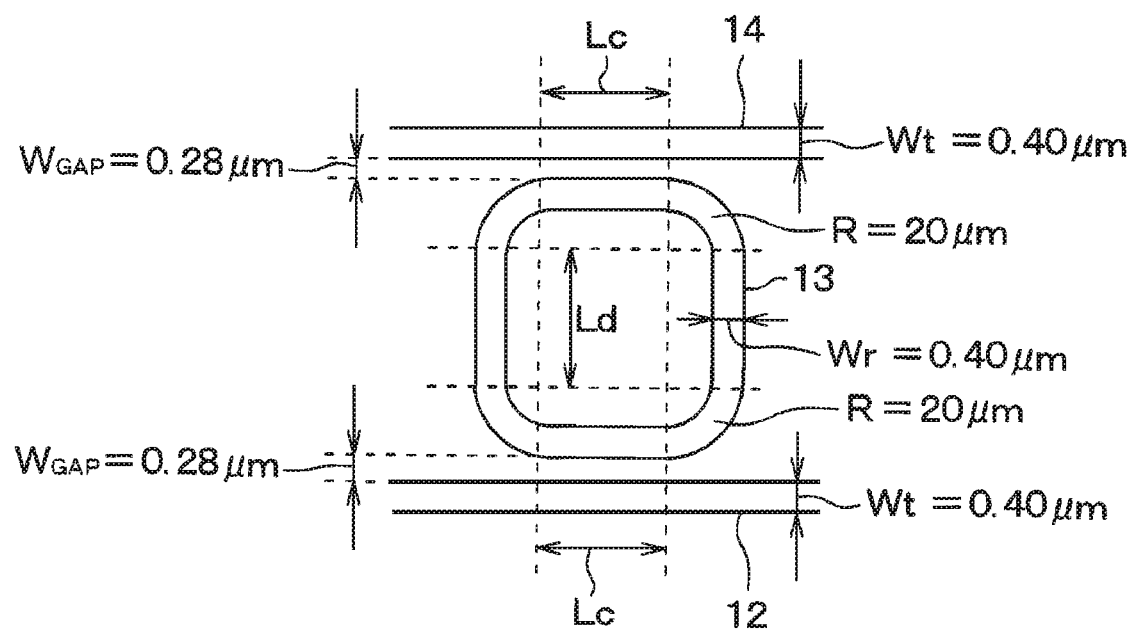
FIG. 2A is an explanatory diagram of a dimension and the like of each part of a first waveguide, a first ring resonator, and a second waveguide.
Figure 2B:
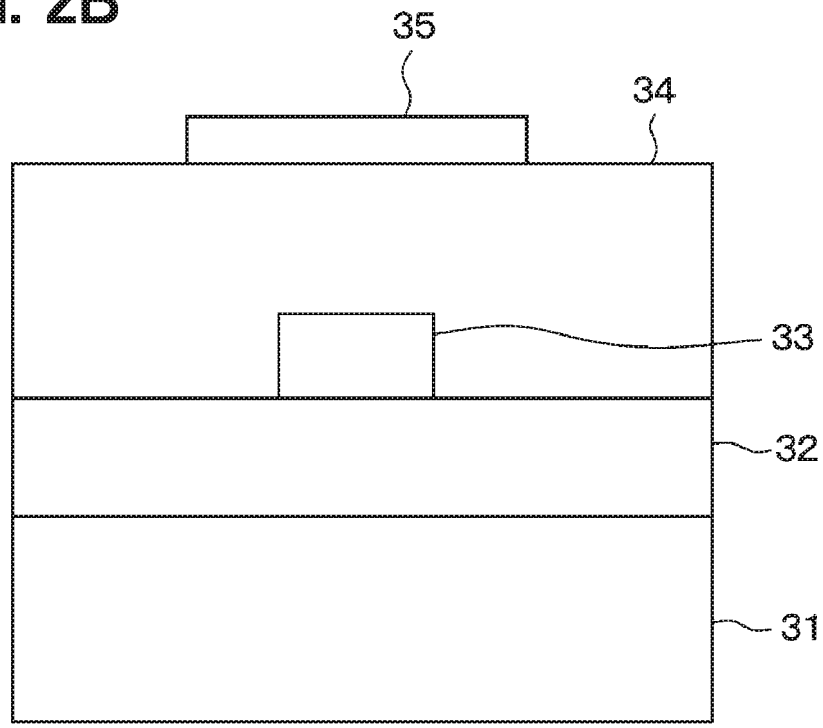
FIG. 2B is a sectional view of a part of the first ring resonator.

Each of the first ring resonator 13 and the second ring resonator 15 is provided with a heater 35 as illustrated in FIG. 2B. Each of the first ring resonator 13 and the second ring resonator 15 is capable of intentionally changing the FSR of the transmission spectrum by being heated by the heater 35.

Details of each part of the first waveguide 12, the second waveguide 14, and the first ring resonator 13 are described with reference to FIGS. 2A and 2B. An example of the dimension of each part in the first ring resonator 13, and the first waveguide 12 and the second waveguide 14 which are disposed on both sides of the first ring resonator 13 is described. The same applies to the second ring resonator 15, and the second waveguide 14 and the third waveguide 16 which are disposed on both sides of the second ring resonator 15 except some parts.

As illustrated in FIG. 2A, a width Wt of the first waveguide 12 and a width Wt of the second waveguide 14 are set to the same width. In the present embodiment, the width Wt is 0.40 μm. The first ring resonator 13 has a rectangular shape whose four corners are quadrants. A width Wr of the first ring resonator 13 is 0.40 μm which is the same as the width Wt. A straight part of the first ring resonator 13, the straight part being opposed to the first waveguide 12 and the second waveguide 14, is mainly optically coupled to the first waveguide 12 and the second waveguide 14 and has a coupling length Lc. A part of the first ring resonator 13, the part being perpendicular to the straight part opposed to the first waveguide 12 and the second waveguide 14, has a length Ld. The radius of curvature R of the quadrant is, for example, 20 μm. The perimeter Lring of the first ring resonator 13 is 2×Lc+2×Ld+2πR and set by adjusting the coupling length Lc and the length Ld.

The coupling length Lc is set taking into consideration a coupling efficiency κ with the first waveguide 12 and the second waveguide 14. The coupling efficiency κ may be set based on the coupling length Lc, an inter-waveguide gap $W_{GAP}$ which is the distance between the first ring resonator 13 and the first waveguide 12 or the second waveguide 14, and the width Wr, Wt of each waveguide. The coupling efficiency κ may differ or be the same between coupling between the first ring resonator 13 and the first waveguide 12 and coupling between the first ring resonator 13 and the second waveguide 14. In the present embodiment, the first waveguide 12 and the second waveguide 14 have the same width Wt and also have the same inter-waveguide gap $W_{GAP}$ of 0.28 μm. The coupling length Lc is varied between the first ring resonator 13 and the second ring resonator 15 to obtain different coupling efficiencies κ.

As illustrated in FIG. 2B, the first ring resonator 13 includes a support substrate 31, an under-clad layer 32, a core layer 33, an over-clad layer 34, and the heater 35 which are stacked together.

The support substrate 31 includes a silicon substrate or the like and has a thickness of, for example, 725 μm. The under-clad layer 32 includes an insulator film such as a silicon oxide film. The under-clad layer 32 is formed with a thickness of, for example, 2 μm on the support substrate 31. The core layer 33 is a part included in a waveguide of the first ring resonator 13, and includes silicon or the like. The core layer 33 is patterned so that its upper face shape has the shape of the first ring resonator 13. The width of the core layer 33 corresponds to the width Wr of the first ring resonator 13. For example, the width of the core layer 33 is 0.40 μm, and the thickness of the core layer 33 is 0.22 μm. The over-clad layer 34 includes an insulator film such as a silicon oxide film. The over-clad layer 34 is formed with a thickness of, for example, 3 μm so as to cover the core layer 33. The heater 35 is formed on the over-clad layer 34 at a position corresponding to the core layer 33. The heater 35 has a thickness of 0.12 μm. The heater 35 includes a heating material capable of heating the core layer 33 by energization, such as Ta, TiN, or TaN.

Although the cross-sectional structure of the first ring resonator 13 has been described above, the second ring resonator 15 also has a similar structure. The first to third waveguides 12, 14, 16 have the cross-sectional configuration illustrated in FIG. 2B from which the heater 35 is not provided. A silicon on insulator (SOI) substrate is used as the support substrate 31, the under-clad layer 32, and the core layer 33, and the core layer 33 is formed by patterning an active layer in the SOI substrate.

The modulator 17 modulates the phase of internal outgoing light passing through the third waveguide 16. For example, a phase modulator using a thermo-optic effect, a carrier plasma effect, or an electrooptic effect is used as the modulator 17. The modulator 17 may be disposed not on the third waveguide 16, but on the first waveguide 12 or the second waveguide 14.

The loop mirror 18 corresponds to a second reflector and plays a role in transmitting internal outgoing light transmitted from the third waveguide 16 in a loop form so as to transmit the internal outgoing light to the third waveguide 16 again.

The SOA 2 includes, for example, a III-V compound semiconductor structure and serves as a light source that amplifies and outputs light. The SOA 2 is connected to and integrated with the optical filter 1 by sticking one face 2a (or a first face 2a) to the end face 10a of the semiconductor substrate 10. The SOA 2 is connected to the end face 10a on the one face 2a through a matching oil or an ultraviolet curable resin (not illustrated) so as to be optically coupled to the first waveguide 12.

The other face 2b (or a second face 2b) of the SOA 2 serves as an emission surface of external outgoing light. The reflecting mirror 21 corresponding to a first reflector is disposed on the other face 2b. The reflecting mirror 21 reflects internal outgoing light to return the internal outgoing light toward the optical filter 1 while extracting external outgoing light from the SOA 2 to the outside. In a mode that extracts external outgoing light to the outside while reflecting internal outgoing light in the reflecting mirror 21 as with the present embodiment, typically, the reflectivity of the reflecting mirror 21 is approximately 1 to 10%. The SOA 2 is provided with an electrode (not illustrated), and capable of varying output of external outgoing light based on current injected from the electrode.

In this manner, the laser light source is configured by combining the optical filter 1 and the SOA 2. Such a laser light source constitutes the Fabry-Perot resonator which reflects internal outgoing light by the reflecting mirror 21 and the loop mirror 18 and creates a resonant state having longitudinal modes between the reflecting mirror 21 and the loop mirror 18. Then, due to a strong resonant state of the first ring resonator 13 and the second ring resonator 15, one or more of the longitudinal modes are selected, laser oscillation occurs at a wavelength where the strong resonant state is generated, and strong light is induced and emitted from the reflecting mirror 21 and output as external outgoing light.

Figure 8:
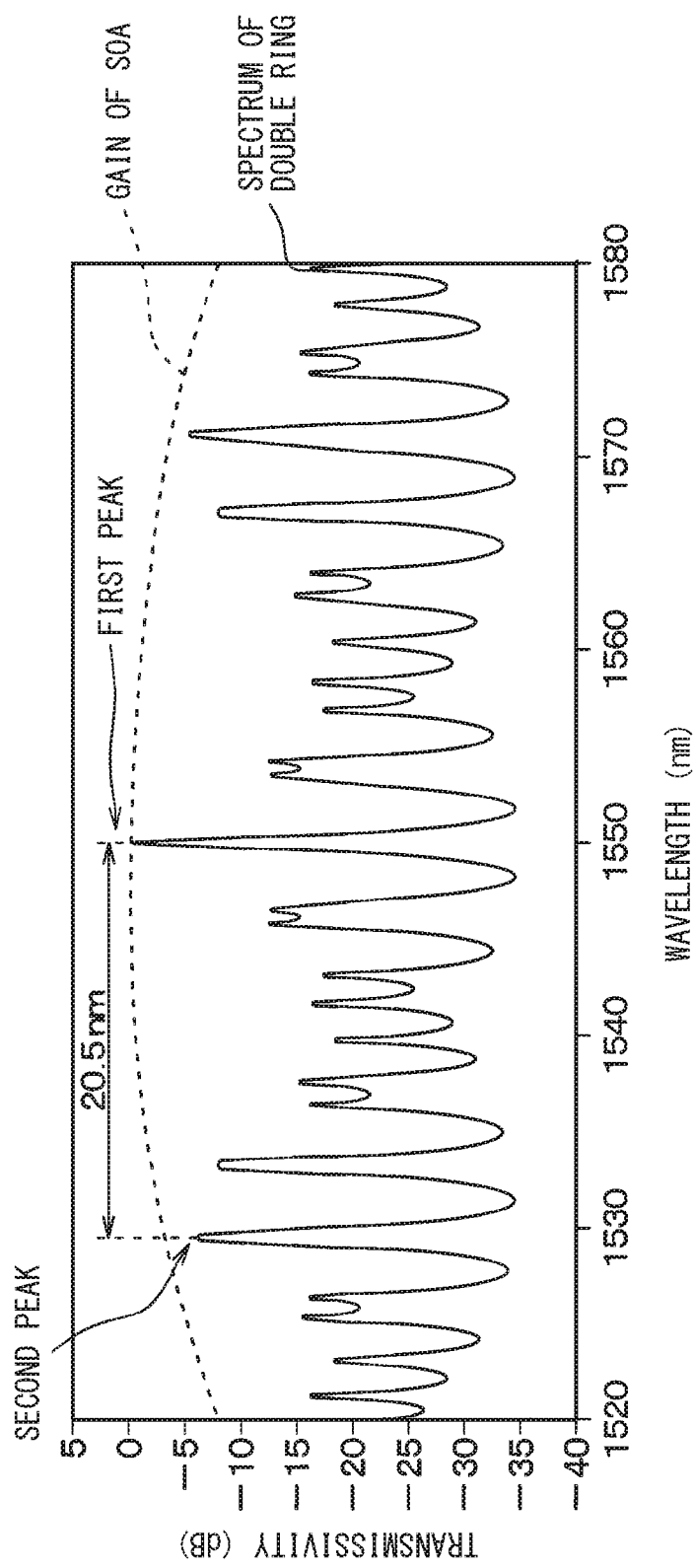
FIG. 8 is a waveform chart illustrating a relationship between a transmission spectrum of a double ring corresponding to a synthetic spectrum of the transmission spectrums generated by the respective ring resonators illustrated in FIG. 7 and a gain of a SOA.

In the laser light source of the present embodiment, as illustrated in FIG. 8 (described later), a highest first peak of the transmission spectrum of the double ring and a second highest second peak thereof are not adjacent to each other, but separated from each other. A peak lower than the first peak and the second peak is located between the first peak and the second peak in the transmission spectrum of the double ring by generating the transmission spectrum having a predetermined FSR in each of the first ring resonator 13 and the second ring resonator 15. Accordingly, it is possible to prevent a mode hop in which the longitudinal mode selected by the two ring resonators 13, 15 changes, the mode hop being caused by using the two ring resonators 13, 15 having close FSRs. For the reason why this effect is obtained, the operation of the laser light source of the present embodiment is described with a comparison with a conventional laser light source.

The configuration of the conventional laser light source is substantially similar to the configuration of the laser light source of the present embodiment illustrated in FIG. 1 except that ring resonators have different perimeters. For convenience, the comparative laser light source is described with reference to the reference signs illustrated in FIG. 1.

Figure 3:
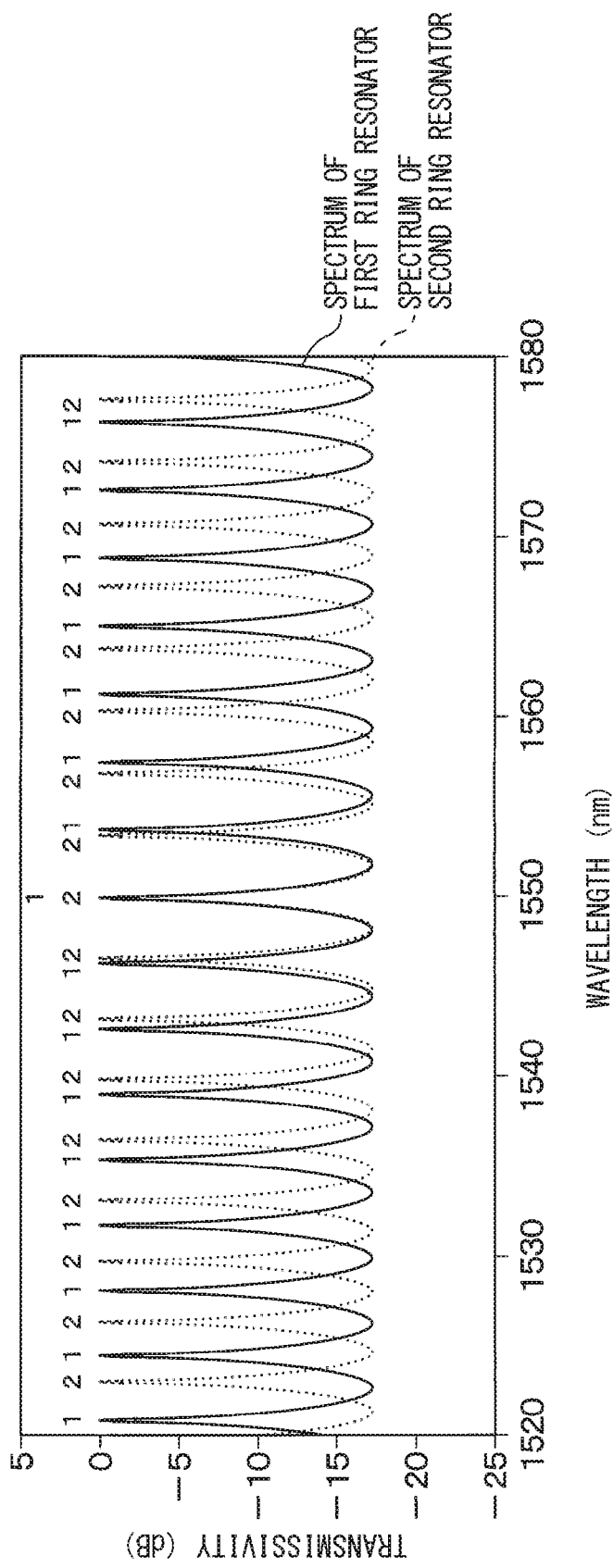
FIG. 3 is a waveform chart of transmission spectrums generated by respective ring resonators of a comparative laser light source.

The transmission spectrum generated by each of the ring resonators 13, 15 of the conventional laser light source is as shown in FIG. 3. Here, a simulation is performed using the conventional laser light source in which the perimeter of the first ring resonator 13 is 151.3 μm and the perimeter of the second ring resonator 15 is 165.1 μm.

As shown in FIG. 3, the FSR of the transmission spectrum of the second ring resonator 15 is slightly shifted with respect to the FSR of the transmission spectrum of the first ring resonator 13, and peaks of the transmission spectrums overlap at any wavelength, a wavelength of 1550 nm in FIG. 3. Here, an example in which the first peak is present near a wavelength of 1550 nm is shown. There are plural wavelengths corresponding to the first peak on both the shorter wavelength side and the longer wavelength side than 1550 nm. On the shorter wavelength side than 1550 nm, peaks of the transmission spectrum of the first ring resonator 13 and peaks of the transmission spectrum of the second ring resonator 15 are alternately present in order. On the longer wavelength side than 1550 nm, peaks of the transmission spectrum of the second ring resonator 15 and peaks of the transmission spectrum of the first ring resonator 13 are alternately present in order. In FIG. 3, the peaks of the transmission spectrum of the first ring resonator 13 are indicated by "1", and the peaks of the transmission spectrum of the second ring resonator 15 are indicated by "2" for easy distinction.

Figure 4:
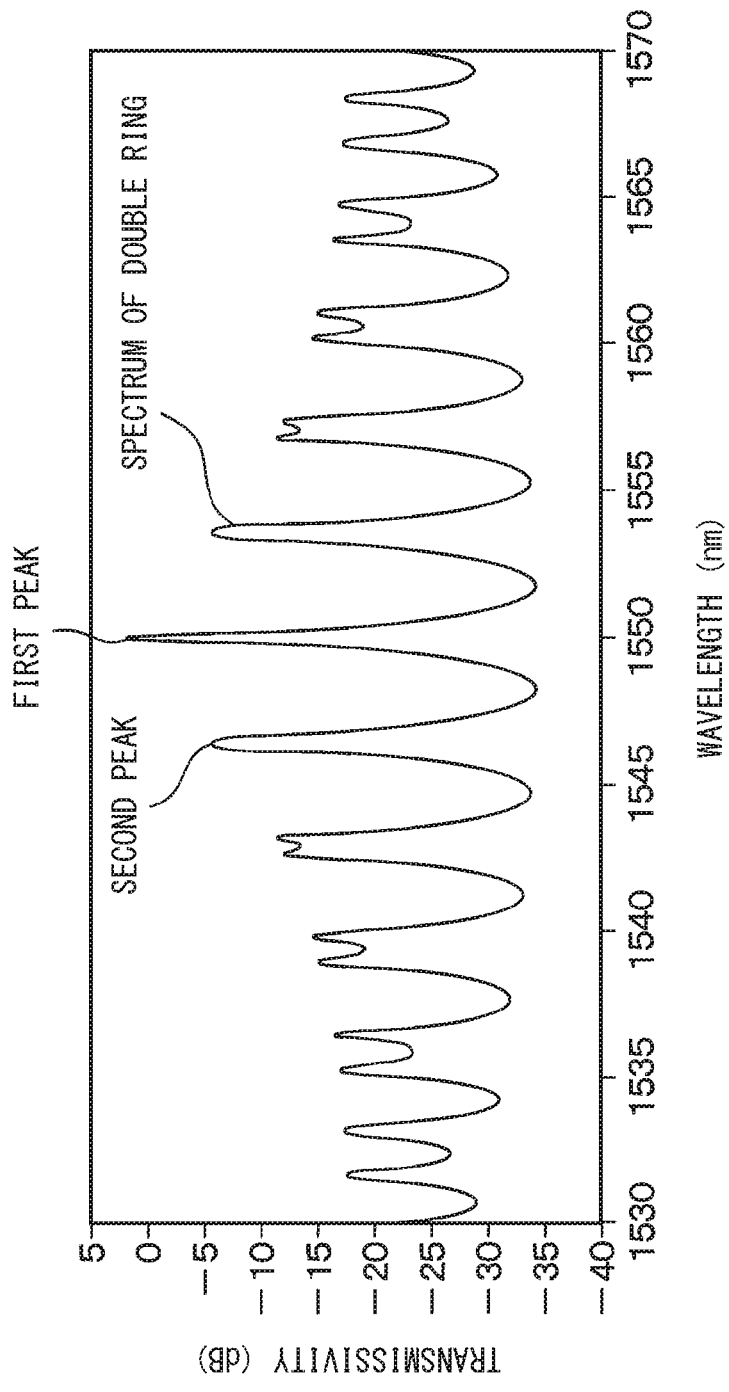
FIG. 4 is a waveform chart of a transmission spectrum of a double ring corresponding to a synthetic spectrum of the transmission spectrums generated by the respective ring resonators illustrated in FIG. 3.

A waveform of a transmission spectrum of a double ring corresponding to a synthetic spectrum of the transmission spectrums of the two ring resonators is as shown in FIG. 4. The transmission spectrum of the double ring achieves a single mode by selecting one longitudinal mode using the two ring resonators and has a highest peak at a wavelength where a strong resonant state is generated.

The transmission spectrum has the second peaks at wavelengths adjacent, on both sides, to the wavelength where a strong resonant state is generated. When a change in the temperature difference of, for example, 1° C. or more occurs between the two ring resonators, a mode hop tends to occur. In the laser light source provided with the SOA, when the second peak rises due to a change in the temperature difference between the two ring resonators, oscillation tends to occur at the second peak, and the wavelength of external outgoing light is shifted.

Figure 5:
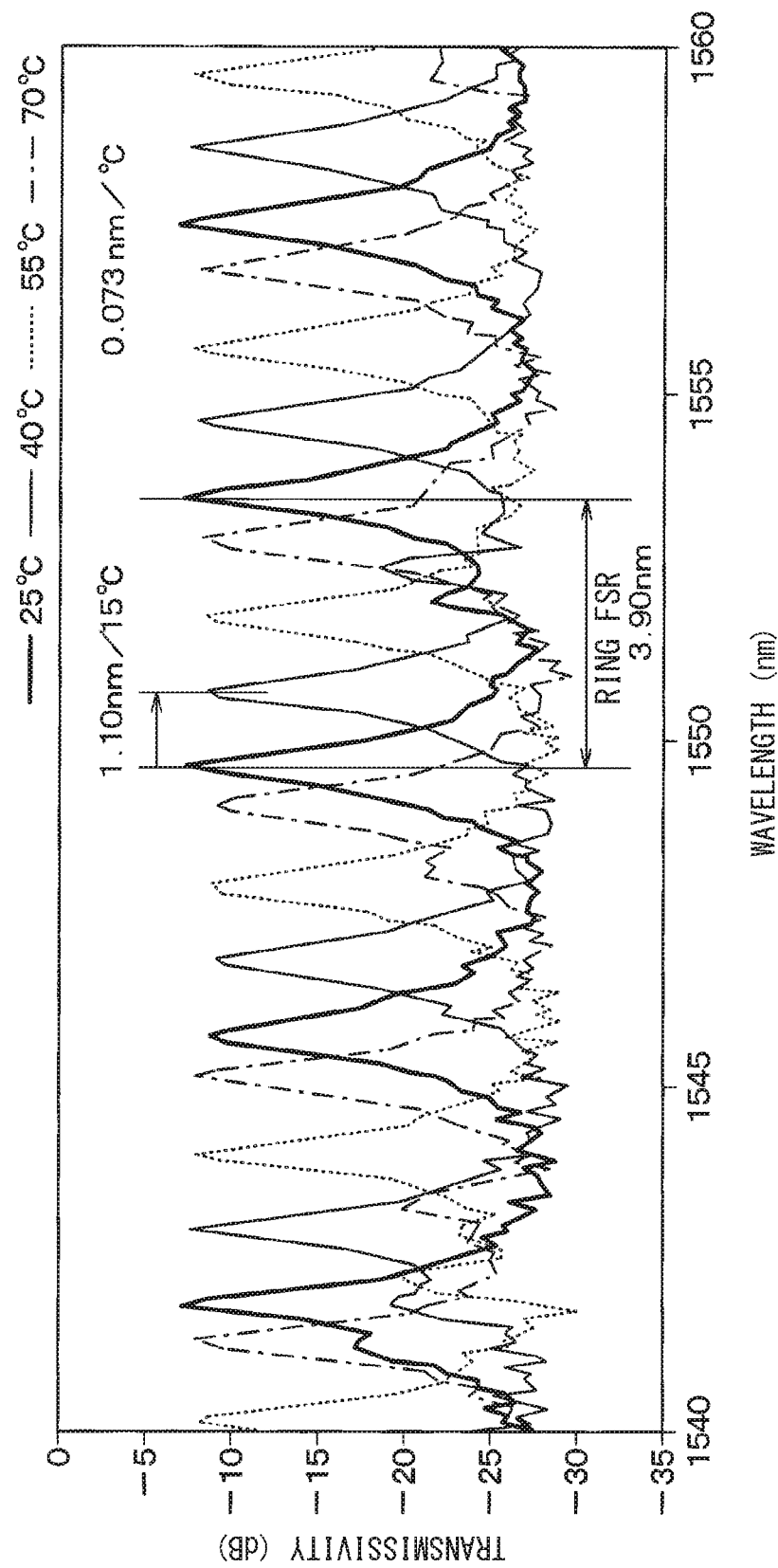
FIG. 5 is a waveform chart illustrating changes in wavelength and transmissivity when a temperature change occurs.

For example, the temperature characteristic of the ring resonator is as shown in FIG. 5. FIG. 5 shows a result obtained by measuring the transmission spectrum when the temperature of the ring resonator is set to 25° C., 40° C., 55° C., and 70° C. As shown in FIG. 5, the FSR of the ring resonator is 3.90 nm, and the wavelength of the transmission spectrum is shifted by 1.10 nm by changing the temperature by 15° C. from 25° C. to 40° C. A wavelength temperature coefficient corresponding to the amount of change in wavelength of the transmission spectrum per 1° C. is 0.073 nm/C.

When the temperature difference between the two ring resonators changes, peaks of the transmission spectrums do not overlap at the wavelength where the peaks should originally overlap, but overlap at a wavelength adjacent thereto. The peak of the transmission spectrum rises, and oscillation tends to occur at the wavelength originally having the second peak.

Figure 6:
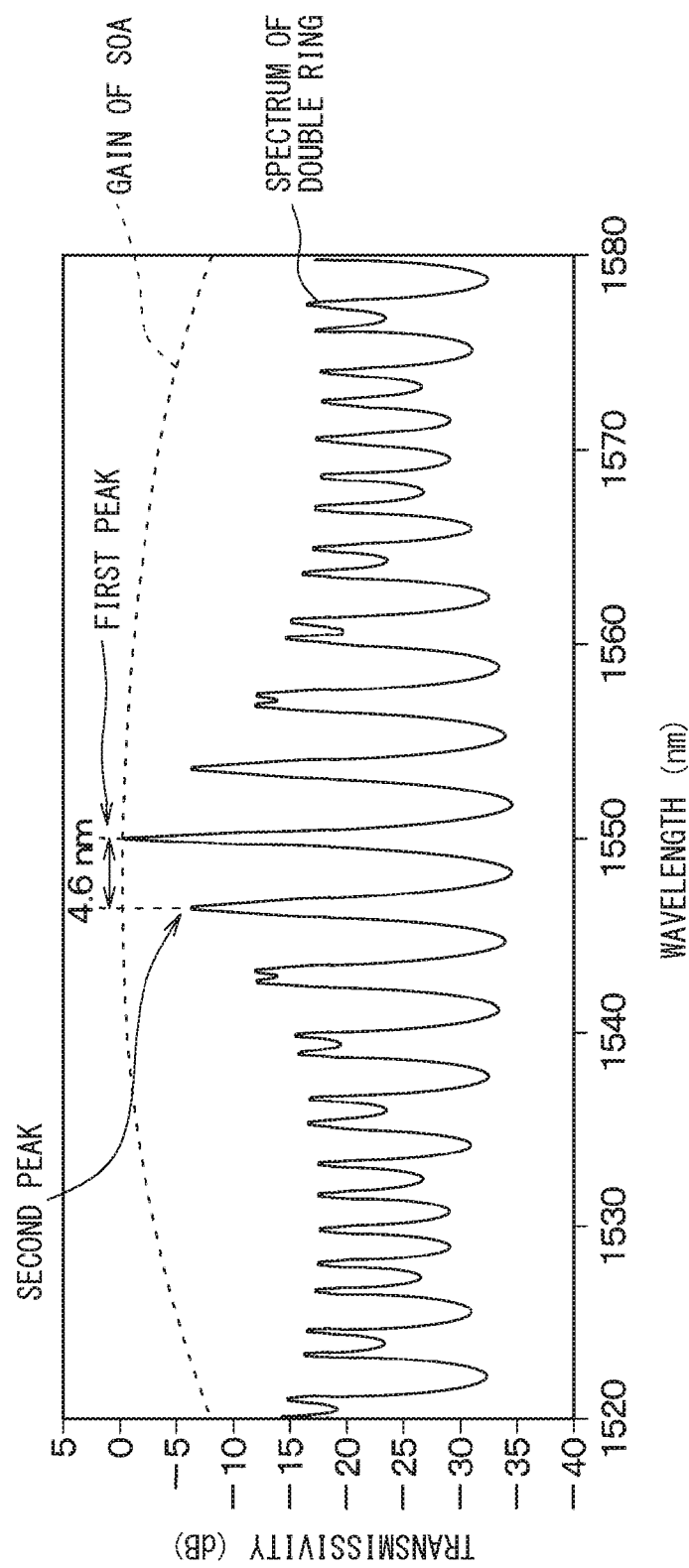
FIG. 6 is a waveform chart illustrating a relationship between the transmission spectrum of the double ring and a gain of a SOA in the comparative laser light source.

An oscillation condition of internal outgoing light in the optical filter is that a value obtained by adding the transmissivity of the double ring and a gain of the SOA 2 becomes a large value at an oscillation wavelength. As illustrated in FIG. 6, the gain of the SOA 2 forms a curve gradually falling from the first peak as the wavelength separates from the first peak. The gain of the SOA 2 is high near the first peak. When the peak of the transmission spectrum rises at the wavelength originally having the second peak, the value obtained by adding the transmissivity and the gain of the SOA 2 becomes a large value, which facilitates satisfying the oscillation condition.

Since the second peaks are located adjacent, on both sides, to the first peak in this manner, when the transmission spectrum to be the second peak rises, the transmission spectrum rises at a point where the gain of the SOA 2 is high. The oscillation condition is disadvantageously satisfied.

Figure 7:
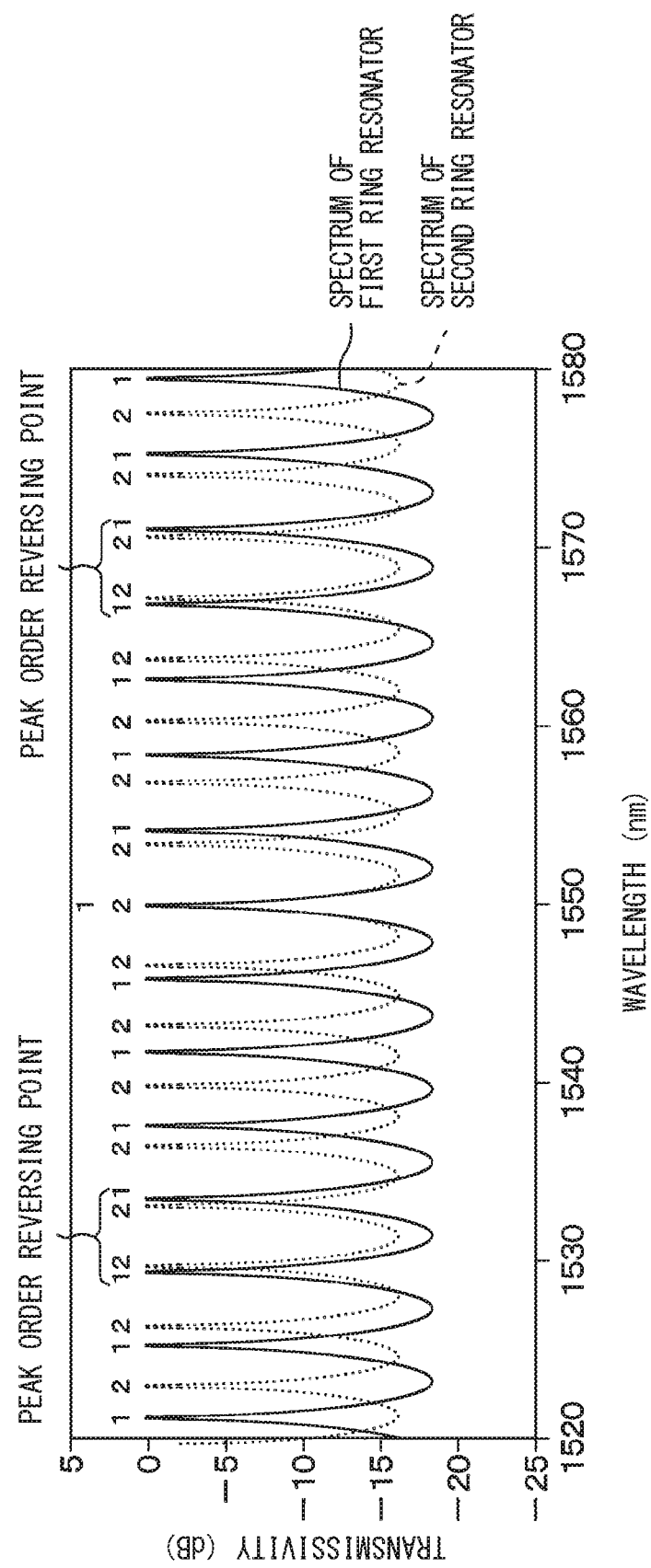
FIG. 7 is a waveform chart of transmission spectrums generated by respective ring resonators of the laser light source according to the first embodiment.

In the laser light source of the present embodiment, the transmission spectrum having a predetermined FSR is generated in each of the first ring resonator 13 and the second ring resonator 15 so that the highest first peak of the transmission spectrum of the double ring and the second highest second peak thereof are not adjacent to each other, but separated from each other. The transmission spectrum generated by each of the ring resonators 13, 15 of the laser light source of the present embodiment is as shown in FIG. 7. Here, a simulation is performed using the laser light source of the present embodiment in which the perimeter of the first ring resonator 13 is 134.9 μm and the perimeter of the second ring resonator 15 is 164.5 μm.

As illustrated in FIG. 7, the FSR of the transmission spectrum of the second ring resonator 15 is slightly shifted with respect to the FSR of the transmission spectrum of the first ring resonator 13, and peaks of the transmission spectrums overlap at any wavelength, a wavelength of 1550 nm in FIG. 7. On both the shorter wavelength side and the longer wavelength side than 1550 nm, the peaks of the transmission spectrum of the first ring resonator 13 and the peaks of the transmission spectrum of the second ring resonator 15 are alternately present in order. In FIG. 7, the peaks of the transmission spectrum of the first ring resonator 13 are indicated by "1", and the peaks of the transmission spectrum of the second ring resonator 15 are indicated by "2" for easy distinction.

Not only the peaks of the transmission spectrum of the first ring resonator 13 and the peaks of the transmission spectrum of the second ring resonator 15 are alternately present in order, but also there is an order reversing point where the order of the peaks is reversed on the shorter wavelength side and the longer wavelength side. On the shorter wavelength side, the peaks of the transmission spectrums are alternately present in the order the peak of the first ring resonator 13 first and the peak of the second ring resonator 15 second up to a wavelength of 1530 nm, and the peaks of the transmission spectrums are alternately present in the order the peak of the second ring resonator 15 first and the peak of the first ring resonator 13 second between 1530 nm and 1550 nm. In this manner, the order reversing point is present near the wavelength of 1530 nm. In the present embodiment, a crest of the transmission spectrum of the first ring resonator 13 and a crest of the transmission spectrum of the second ring resonator 15 overlap at the wavelength of the first peak such as 1550 nm, and troughs of the respective transmission spectrums overlap at the order reversing point. The first peak is present also at a wavelength shorter or longer than 1550 nm. A part where the troughs of the respective transmission spectrums overlap is present at the midpoint between wavelengths corresponding to the adjacent first peaks where the crests of the respective transmission spectrums overlap.

The waveform of the transmission spectrum of the double ring corresponding to the synthetic spectrum of the transmission spectrums of the two ring resonators is as illustrated in FIG. 8. The transmission spectrum of the double ring has the highest first peak at the wavelength at resonance, and the wavelength of the second peak is separated from the first peak. In the example of FIG. 8, there is a wavelength shift of 20.5 nm between the first peak and the second peak, and plural peaks lower than the second peak are located between the first peak and the second peak.

The second peak of the spectrum is present not at wavelengths adjacent, on both sides, to the wavelength where a strong resonant state is generated. A mode hop is less likely to occur when the temperature difference between the two ring resonators changes. In the laser light source provided with the SOA 2, even when the second peak rises due to a change in the temperature difference between the two ring resonators, it is possible to make oscillation less likely to occur at the second peak. It is possible to reliably cause oscillation at the first peak.

As described above, the oscillation condition of internal outgoing light in the optical filter is that the value obtained by adding the transmissivity of the double ring and the gain of the SOA 2 becomes a large value at the oscillation wavelength. As illustrated in FIG. 8, the gain of the SOA 2 forms a curve gradually falling from the first peak as the wavelength separates from the first peak. The gain of the SOA 2 also becomes high near the first peak. Since the gain of the SOA 2 is reduced as separating from the first peak, the gain of the SOA 2 is lower than the highest gain at the wavelength of the second peak in the present embodiment. Even when the second peak rises, the value obtained by adding the transmissivity and the gain of the SOA 2 does not become so large, which makes it difficult to satisfy the oscillation condition.

In this manner, the second peak is not adjacent, on both sides, to the first peak, but separated from the first peak. Even when the transmission spectrum to be the second peak rises, the peak of the transmission spectrum rises at a point where the gain of the SOA 2 is not high. It is possible to prevent the oscillation condition from being satisfied.

As described above, in the present embodiment, the transmission spectrum having a predetermined FSR is generated in each of the first ring resonator 13 and the second ring resonator 15 so that the highest first peak of the transmission spectrum of the double ring and the second highest second peak of the transmission spectrum of the double ring are not adjacent to each other, but separated from each other. In order to satisfy such a condition, the FSR of each of the transmission spectrums generated by the first ring resonator 13 and the second ring resonator 15 may be set so that the order reversing point where the order of the peaks is reversed is present at a position different from the first peak.

In this manner, the wavelength of the highest first peak and the wavelength of the second highest second peak are separated from each other. Even if the second peak rises, and the highest first peak is interchanged with the second peak, since the second peak is separated from the wavelength originally having the first peak, the interchange may be relatively easily detected. Accordingly, it is possible to prevent a mode hop without an additional element. In the case where the optical filter 1 is applied to the laser light source, even when the transmission spectrum to be the second peak rises, the transmission spectrum rises at the point where the gain of the SOA 2 is not high. It is possible to prevent the oscillation condition from being satisfied. An optical filter capable of preventing a mode hop without an additional element and a laser light source using the optical filter may be obtained.

The laser light source as described above may be applied to an optical transceiver provided with a laser light source such as a laser radar apparatus for vehicle. The laser light source may be applied to an optical transceiver that outputs external outgoing light having a specific wavelength from the laser light source and receives reflected light, which is the external outgoing light colliding with an obstacle, and being reflected and returned, by a receiver (not illustrated) to measure a distance to the obstacle. Such an optical transceiver may have a use mode that outputs light to the outside while changing the wavelength of the light. In this case, the light may be accurately output at a desired wavelength by using the laser light source described in the present embodiment. It is possible to more accurately measure the distance to an obstacle.

Examples of the dimension of each part of the first ring resonator 13 and the second ring resonator 15 have been described in the present embodiment. The described dimensions are merely examples, and the present disclosure is not limited to the dimensions described above. Hereinbelow, a change in the transmission spectrum of the double ring is described together with the dimension of each part of the first ring resonator 13 and the second ring resonator 15 with examples and comparative examples.

EXAMPLES

First Example

Figures 9, 10A, 10B:
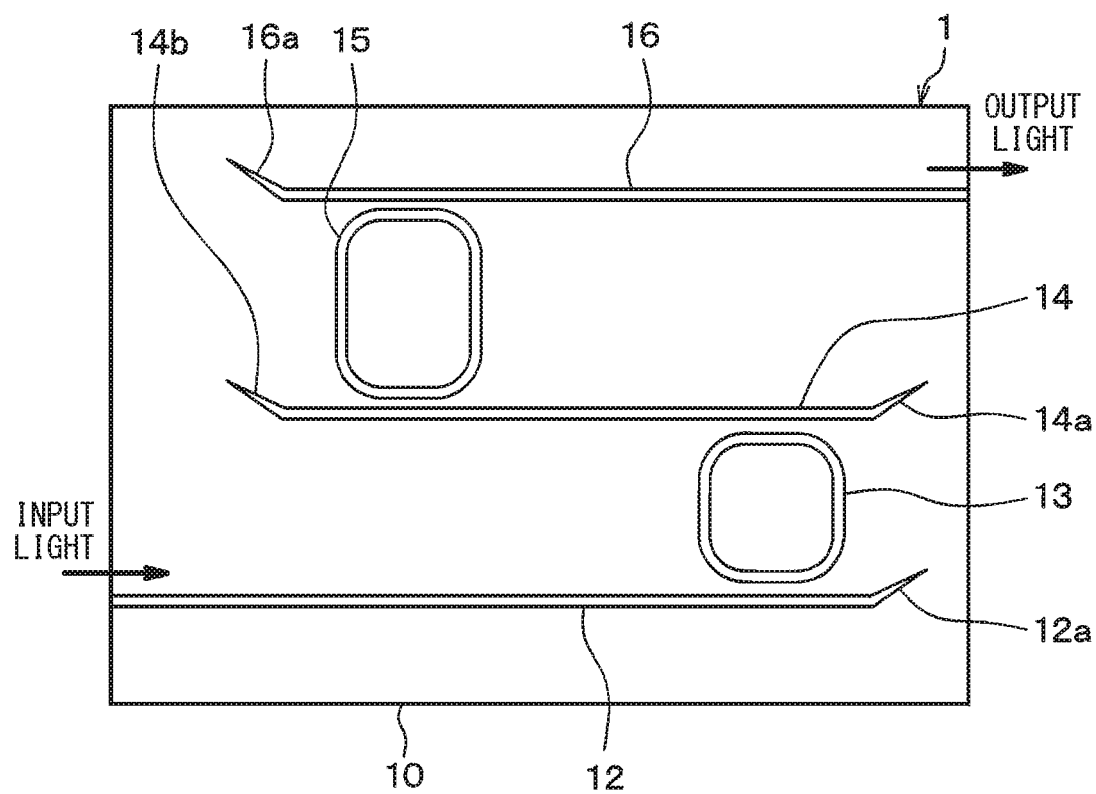
FIG. 9 is a schematic configuration diagram of an optical filter according to a first example.
FIG. 10A is a table showing values of parameters of the optical filter according to the first example.
FIG. 10B is a table showing peak positions in each of conditions a1 to a3.

In the present example, a change in the transmission spectrum of the double ring was examined in an optical filter illustrated in FIG. 9. As illustrated in FIG. 9, the optical filter 1 of the present example has a mode in which the SSC 11, the modulator 17, and the loop mirror 18 are not provided in the optical filter 1 described in the above embodiment, and input light is introduced into the first waveguide 12 and output light is emitted from the third waveguide 16. Coherent light is used as the input light. Light of a laser light source, a super luminescence diode (SLED), or the like may be used.

In such a configuration, values of parameters such as the dimension of each part and the coupling efficiency κ are as shown in FIG. 10A. In the following description, Lring1 denotes the perimeter of the first ring resonator 13, and Lring2 denotes the perimeter of the second ring resonator 15. Lc1 denotes the coupling length between the first ring resonator 13 and the first waveguide 12 or the second waveguide 14, and Lc2 denotes the coupling length between the second ring resonator 15 and the second waveguide 14 or the third waveguide 16. κ1 denotes the coupling efficiency between the first ring resonator 13 and the first waveguide 12, and κ2 denotes the coupling efficiency between the second ring resonator 15 and the second waveguide 14.

As illustrated in FIG. 10B, a peak change in the transmission spectrum of the double ring was checked by a simulation for conditions a1 to a3 in the optical filter 1. A first peak position changed as shown in FIG. 10B. FIG. 11 illustrates the transmission spectrum of the double ring in each condition.

First, the condition a1 shows the transmission spectrum of the double ring when the relative temperature of the first ring resonator 13 relative to the temperature of the second ring resonator 15 is 0° C., the temperature difference between the first ring resonator 13 and the second ring resonator 15 is 0° C. In this case, a peak (1) near a wavelength of 1550 nm and a peak (3) near a wavelength of 1590 nm were the first peaks, and a peak (2) near a wavelength of 1568 nm was the second peak. A wavelength range of the peaks (1), (3) is a wavelength range where the peak of the transmission spectrum of the first ring resonator 13 and the peak of the transmission spectrum of the second ring resonator 15 overlap. A wavelength range of the peak (2) is a place where the peak of the transmission spectrum of the first ring resonator 13 and the peak of the transmission spectrum of the second ring resonator 15 do not overlap, and originally assumed to have the second peak. In this manner, the first peak was obtained in the wavelength range intended to have the first peak, and the second peak was obtained in the wavelength range intended to have the second peak.

Next, the condition a2 shows the transmission spectrum of the double ring when the relative temperature of the first ring resonator 13 relative to the temperature of the second ring resonator 15 is 2.7° C. In this case, the peak (2) near a wavelength of 1568 nm was the first peak in addition to the peak (1) near a wavelength of 1550 nm and the peak (3) near a wavelength of 1590 nm. In this manner, although the first peak was obtained in the wavelength range intended to have the first peak, the first peak was also present in the wavelength range intended to have the second peak.

Next, the condition a3 shows the transmission spectrum of the double ring when the relative temperature of the first ring resonator 13 relative to the temperature of the second ring resonator 15 is 5.4° C. In this case, the peak (2) near a wavelength of 1568 nm was the first peak, and the peak (1) near a wavelength of 1550 nm and the peak (3) near a wavelength of 1590 nm were the second peaks. The second peak was present in the wavelength range intended to have the first peak, and the first peak was present in the wavelength range intended to have the second peak.

In this manner, in the optical filter 1 of the present example, when the temperature difference between the first ring resonator 13 and the second ring resonator 15 becomes large, the wavelength range of the first peak and the second peak are interchanged with each other. A wavelength change width between the first peak and the second peak is 17.5 nm. If there is an interchange of the first peak, the interchange may be relatively easily detected.

As described above, in the first example, the coupling efficiency κ is varied. This is because design for making the full width at half maximum of each transmission spectrum uniform may be performed. When the difference between the perimeter Lring 1 of the first ring resonator 13 and the perimeter Lring 2 of the second ring resonator 15 is small, the difference in sharpness between the transmission spectrums is small. As the difference in perimeter increases, the difference in sharpness increases. Specifically, the second ring resonator 15 having the larger perimeter Lring 2 has sharper rising of the transmission spectrum than the first ring resonator 13 having the smaller perimeter Lring 1. The rising of the transmission spectrum becomes sharper as the coupling efficiency κ becomes smaller. In the present example, the coupling efficiencies κ1, κ2 have different values. The coupling efficiency κ2 of the second ring resonator 15 having the larger perimeter Lring 2 is set to a large value that makes the rising of the transmission spectrum gentle, and the coupling efficiency κ1 of the first ring resonator 13 having the smaller perimeter Lring 1 is set to a small value that makes the rising of the transmission spectrum sharp. Accordingly, it is possible to make the full width at half maximum of each transmission spectrum uniform. It is possible to prevent the transmission spectrum of the double ring from being dominated by the transmission spectrum having sharp rising to make the interchange of the first peak less likely to occur.

First Comparative Example

Figure 13:
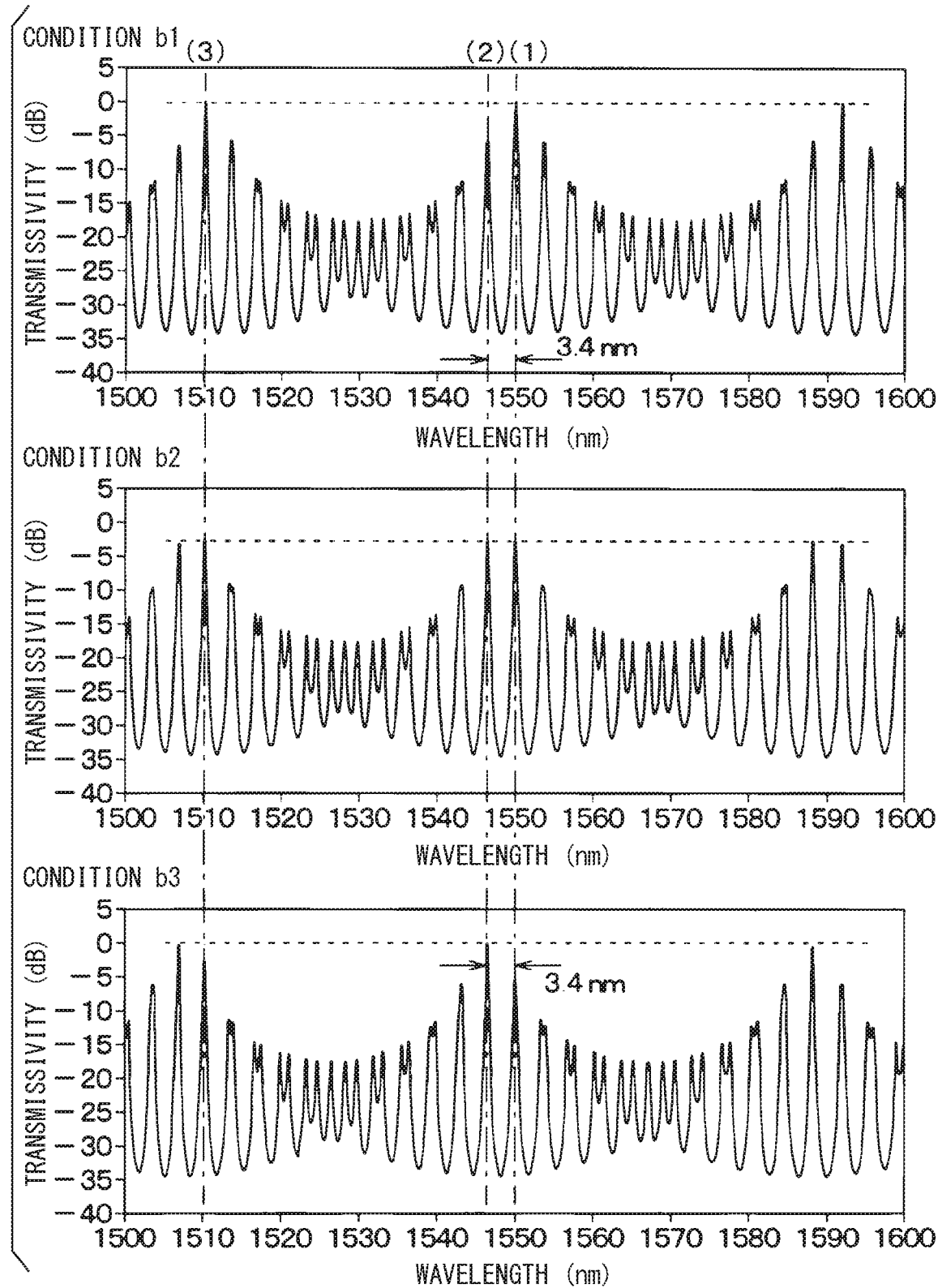
FIG. 13 is a waveform chart of a transmission spectrum of a double ring in each of the conditions b1 to b3.

In the present comparative example, in the optical filter 1 illustrated in FIG. 9, a peak change in the transmission spectrum of the double ring was checked by a simulation for conditions b1 to b3 as illustrated in FIG. 12B by changing parameters such as the dimension of each part and the coupling efficiency κ as illustrated in FIG. 12A. As a result, as illustrated in FIG. 12B, the first peak position changed also in the comparative example. FIG. 13 illustrates the transmission spectrum of the double ring in each condition.

First, the condition b1 shows the transmission spectrum of the double ring when the relative temperature of the first ring resonator 13 relative to the temperature of the second ring resonator 15 is 0° C. In this case, a peak (1) near a wavelength of 1510 nm and a peak (3) near a wavelength of 1550 nm were the first peaks, and a peak (2) near a wavelength of 1545 nm next to 1550 nm was the second peak. A wavelength range of the peaks (1), (3) is a wavelength range where the peak of the transmission spectrum of the first ring resonator 13 and the peak of the transmission spectrum of the second ring resonator 15 overlap. A wavelength range of the peak (2) is a place where the peak of the transmission spectrum of the first ring resonator 13 and the peak of the transmission spectrum of the second ring resonator 15 do not overlap, and originally assumed to have the second peak. In this manner, the first peak was obtained in the wavelength range intended to have the first peak, and the second peak was obtained in the wavelength range intended to have the second peak.

Next, the condition b2 shows the transmission spectrum of the double ring when the relative temperature of the first ring resonator 13 relative to the temperature of the second ring resonator 15 is 2.2° C. In this case, the peak (2) near a wavelength of 1545 nm was the first peak in addition to the peak (1) near a wavelength of 1510 nm and the peak (3) near a wavelength of 1550 nm. In this manner, although the first peak was obtained in the wavelength range intended to have the first peak, the first peak was also present in the wavelength range intended to have the second peak.

Next, the condition b3 shows the transmission spectrum of the double ring when the relative temperature of the first ring resonator 13 relative to the temperature of the second ring resonator 15 is 4.3° C. In this case, the peak (2) near a wavelength of 1545 nm was the first peak, and the peak (1) near a wavelength of 1510 nm and the peak (3) near a wavelength of 1550 nm were the second peaks. The second peak was present in the wavelength range intended to have the first peak, and the first peak was present in the wavelength range intended to have the second peak.

In this manner, also in the optical filter 1 of the present comparative example, when the temperature difference between the first ring resonator 13 and the second ring resonator 15 becomes large, the wavelength range of the first peak and the second peak are interchanged with each other. A wavelength change width between the first peak and the second peak is 3.4 nm and thus small. If there is an interchange of the first peak, it is difficult to detect the interchange. Hence, it is difficult to prevent the interchange of the first peak.

Second Example

In the present example, a change in the transmission spectrum of the double ring was examined in the laser light source illustrated in FIG. 1. In such a configuration, values of parameters such as the dimension of each part and the coupling efficiency κ are as shown in FIG. 14A.

Figure 15:
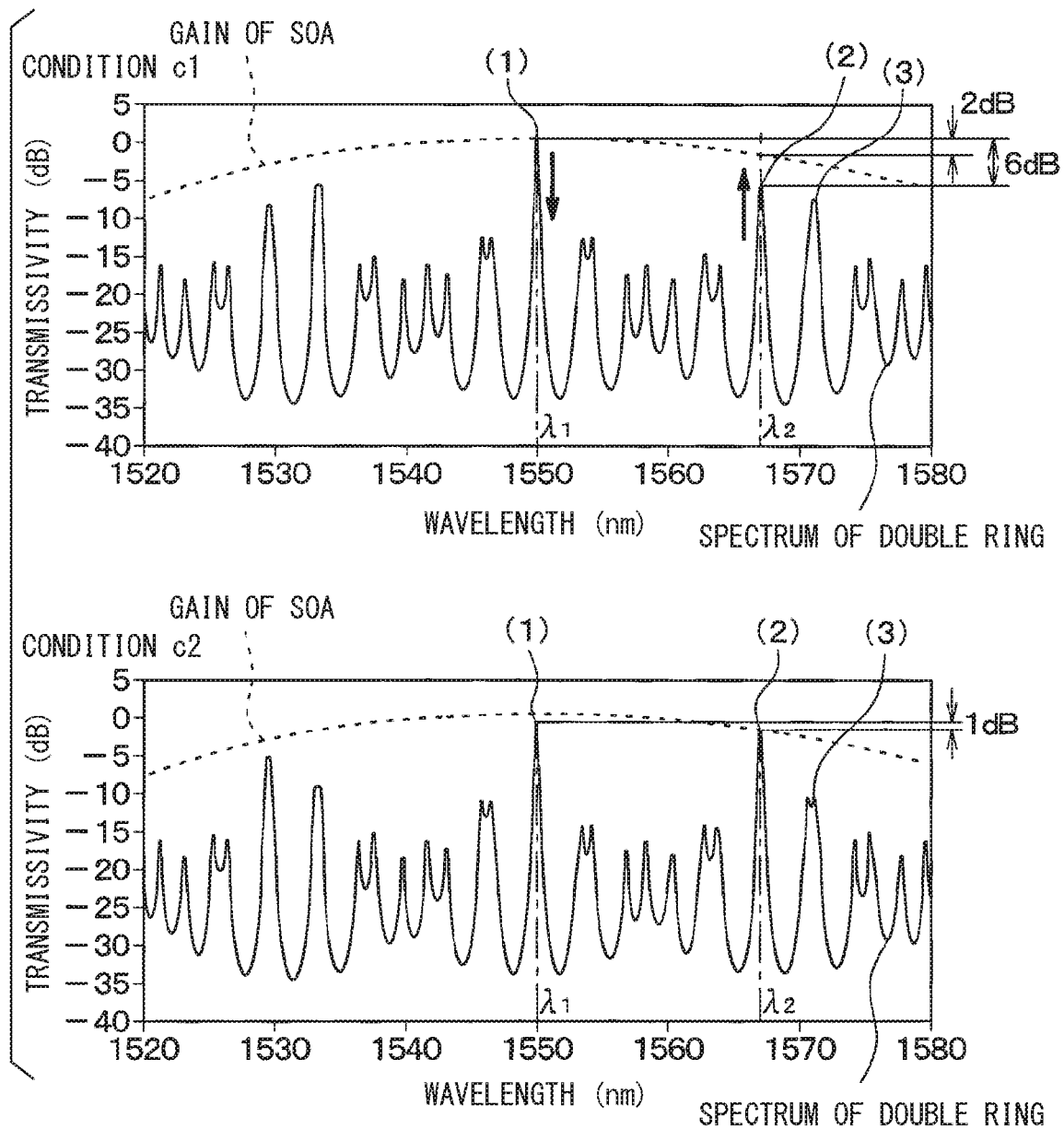
FIG. 15 is a waveform chart of a transmission spectrum of a double ring in each of the conditions c1 to c2.

As illustrated in FIG. 14B, a peak change in the transmission spectrum of the double ring was checked by a simulation for conditions c1 and c2 in such a laser light source. A peak height changed as shown in FIG. 14B. FIG. 15 shows the transmission spectrum of the double ring in each condition.

First, the condition c1 shows the transmission spectrum of the double ring when the relative temperature of the first ring resonator 13 relative to the temperature of the second ring resonator 15 is 0° C. In this case, a peak (1) near a wavelength of 1550 nm was the first peak, and a peak (2) near a wavelength of 1568 nm was the second peak. A peak (3) near a wavelength of 1572 nm was the third peak, and the peak (2) was located between the peak (1) and the peak (3).

A wavelength range of the peak (1) is a wavelength range where the peak of the transmission spectrum of the first ring resonator 13 and the peak of the transmission spectrum of the second ring resonator 15 overlap. Wavelength ranges of the peaks (2), (3) are places where the peak of the transmission spectrum of the first ring resonator 13 and the peak of the transmission spectrum of the second ring resonator 15 do not overlap, and originally assumed to have the second and third peaks. In this manner, the first peak was obtained in the wavelength range intended to have the first peak, and the second and third peaks were obtained in the wavelength ranges intended to have the second and third peaks. At this time, a transmissivity difference Y between the first peak and the second peak in the transmission spectrum of the double ring was 6.0 dB.

In the gain of the SOA 2 in the condition c1, a gain difference X between a wavelength λ1 having the first peak and a wavelength λ2 having the second peak is 2.0 dB. A value X+Y obtained by adding the gain difference X and the transmissivity difference Y between the wavelength λ1 having the first peak and the wavelength λ2 having the second peak was 8.0 dB. When 8.0 dB may be secured as the value X+Y which is the sum of the gain difference X and the transmissivity difference Y in this manner, one of the longitudinal modes of the Fabry-Perot resonator may be extracted by a double ring filter in which two ring resonators are connected in series to cause single-mode oscillation.

Next, the condition c2 shows the transmission spectrum of the double ring when the relative temperature of the first ring resonator 13 relative to the temperature of the second ring resonator 15 is 2.0° C. In this case, the peak (1) near a wavelength of 1550 nm was the first peak, and the peak (2) near a wavelength of 1568 nm was the second peak. The height of the second peak was substantially equal to the height of the first peak. In this manner, although the first peak was obtained in the wavelength range intended to have the first peak, the peak in the wavelength range intended to have the second peak had a height substantially equal to the first peak. At this time, the transmissivity difference Y between the first peak and the second peak in the transmission spectrum of the double ring was 1.0 dB and thus low.

In the condition c2, the gain difference X between a wavelength $\lambda 1$ having the first peak and a wavelength $\lambda 2$ having the second peak is 2.0 dB in the gain of the SOA 2. The value X+Y obtained by adding the gain difference X and the transmissivity difference Y between the wavelength $\lambda 1$ having the first peak and the wavelength $\lambda 2$ having the second peak was 3.0 dB. In order to achieve single-mode oscillation, it is required that the value X+Y be 3.0 dB or higher, and it may be considered that single-mode oscillation may be achieved until the condition c2. In this manner, in the present example, single-mode oscillation may be achieved, and a mode hop may be prevented without an additional element at least when the temperature difference between the first ring resonator 13 and the second ring resonator 15 is 2.0° C. or less.

Third Example

Also in the present example, a change in the transmission spectrum of the double ring was examined in the laser light source illustrated in FIG. 1. In such a configuration, values of parameters such as the dimension of each part and the coupling efficiency κ are as shown in FIG. 16A, and the parameters differ from those of the second example.

Figure 17:
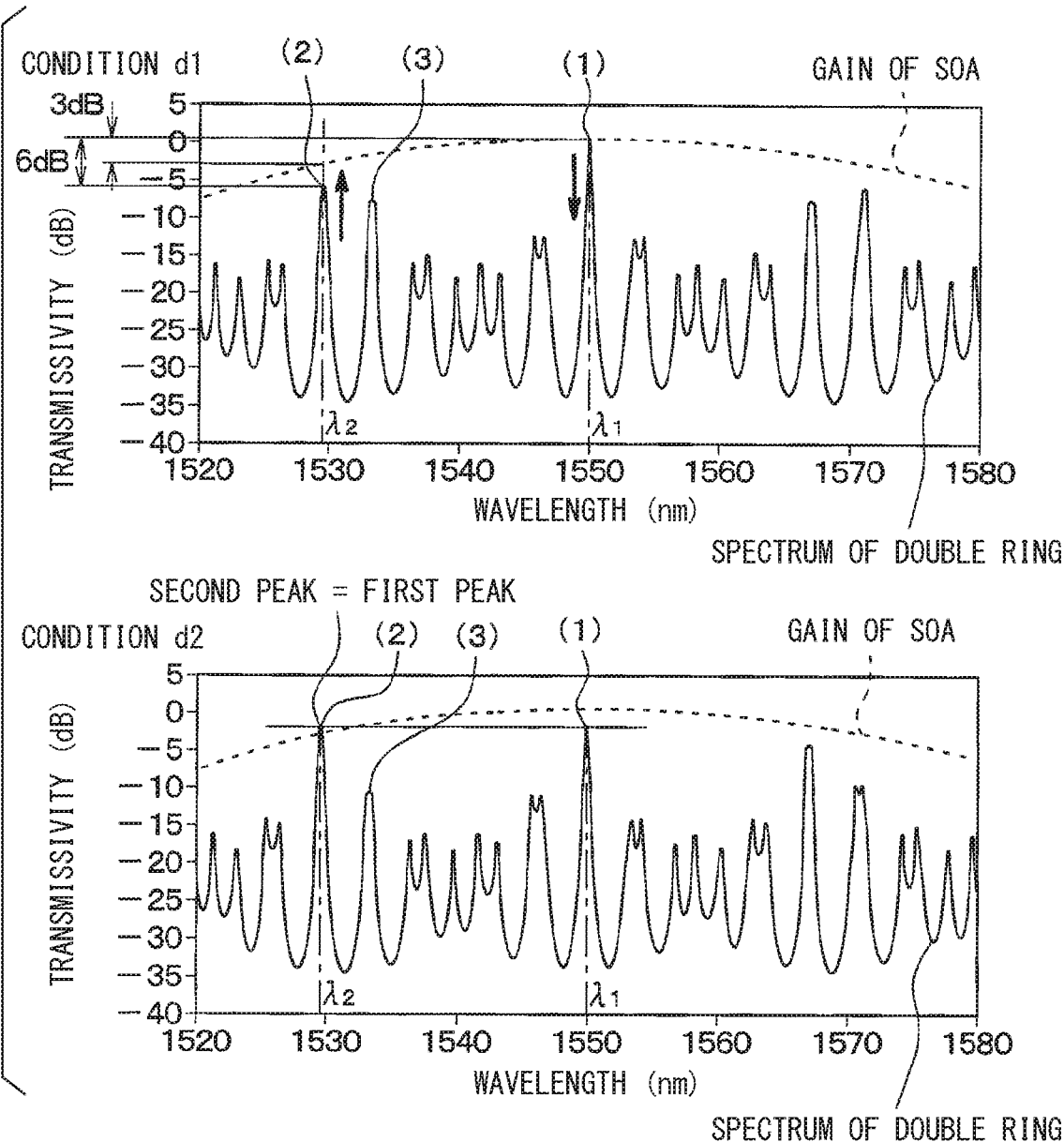
FIG. 17 is a waveform chart of a transmission spectrum of a double ring in each of the conditions d1 to d2.

As illustrated in FIG. 16B, a peak change in the transmission spectrum of the double ring was checked by a simulation for conditions d1 and d2 in such a laser light source. A peak height changed as shown in FIG. 16B. FIG. 17 shows the transmission spectrum of the double ring in each condition.

First, the condition d1 shows the transmission spectrum of the double ring when the relative temperature of the first ring resonator 13 relative to the temperature of the second ring resonator 15 is 0° C. In this case, a peak (1) near a wavelength of 1550 nm was the first peak, and a peak (2) near a wavelength of 1530 nm was the second peak. A peak (3) near a wavelength of 1533 nm was the third peak, and the peak (2) was located on the side opposite to the peak (1) across the peak (3). In other words, the peak (3) was located between the peak (1) and the peak (2).

A wavelength range of the peak (1) is a wavelength range where the peak of the transmission spectrum of the first ring resonator 13 and the peak of the transmission spectrum of the second ring resonator 15 overlap. Wavelength ranges of the peaks (2), (3) are places where the peak of the transmission spectrum of the first ring resonator 13 and the peak of the transmission spectrum of the second ring resonator 15 do not overlap, and originally assumed to have the second and third peaks. In this manner, the first peak was obtained in the wavelength range intended to have the first peak, and the second and third peaks were obtained in the wavelength ranges intended to have the second and third peaks. At this time, a transmissivity difference Y between the first peak and the second peak in the transmission spectrum of the double ring was 6.0 dB.

In the gain of the SOA 2 in the condition d1, a gain difference X between a wavelength $\lambda 1$ having the first peak and a wavelength $\lambda 2$ having the second peak was 3.0 dB. A value X+Y obtained by adding the gain difference X and the transmissivity difference Y between the wavelength $\lambda 1$ having the first peak and the wavelength $\lambda 2$ having the second peak was 9.0 dB. When 9.0 dB may be secured as the value X+Y which is the sum of the gain difference X and the transmissivity difference Y in this manner, one of the longitudinal modes of the Fabry-Perot resonator may be extracted by a double ring filter in which two ring resonators are connected in series to cause single-mode oscillation.

Next, the condition d2 shows the transmission spectrum of the double ring when the relative temperature of the first ring resonator 13 relative to the temperature of the second ring resonator 15 is 2.3° C. In this case, the peak (1) near a wavelength of 1550 nm was the first peak. The height of the peak (2) near a wavelength of 1530 nm was equal to the height of the first peak. In this manner, although the first peak was obtained in the wavelength range intended to have the first peak, the peak in the wavelength range intended to have the second peak had a height equal to the first peak. At this time, the transmissivity difference Y between the first peak and the second peak in the transmission spectrum of the double ring was 0.0 dB.

In the condition d2, the gain difference X between a wavelength $\lambda 1$ having the first peak and a wavelength $\lambda 2$ having the second peak was 3.0 dB in the gain of the SOA 2. A value X+Y obtained by adding the gain difference X and the transmissivity difference Y between the wavelength $\lambda 1$ having the first peak and the wavelength $\lambda 2$ having the other first peak was 3.0 dB. In order to achieve single-mode oscillation, it is required that the value X+Y be 3.0 dB or higher, and it may be considered that single-mode oscillation may be achieved until the condition c2. In this manner, in the present example, single-mode oscillation may be achieved, and a mode hop may be prevented without an additional element at least when the temperature difference between the first ring resonator 13 and the second ring resonator 15 is 2.3° C. or less.

In the present example, the peak (3) is located between the peak (1) and the peak (2). Accordingly, it is possible to further reduce the gain of the SOA 2 at the position of the peak (2). Even when the temperature difference between the first ring resonator 13 and the second ring resonator 15 is large, single-mode oscillation may be more reliably achieved.

Second Comparative Example

In the present comparative example, a change in the transmission spectrum of the double ring was examined in a comparative laser light source having a structure substantially similar to the structure of FIG. 1. In the present comparative example, values of parameters such as the dimension of each part and the coupling efficiency κ are as shown in FIG. 18A. Differently from the second and third examples, the transmission spectrum has the second peak at wavelengths adjacent, on both ends, to a wavelength at resonance.

Figure 19:
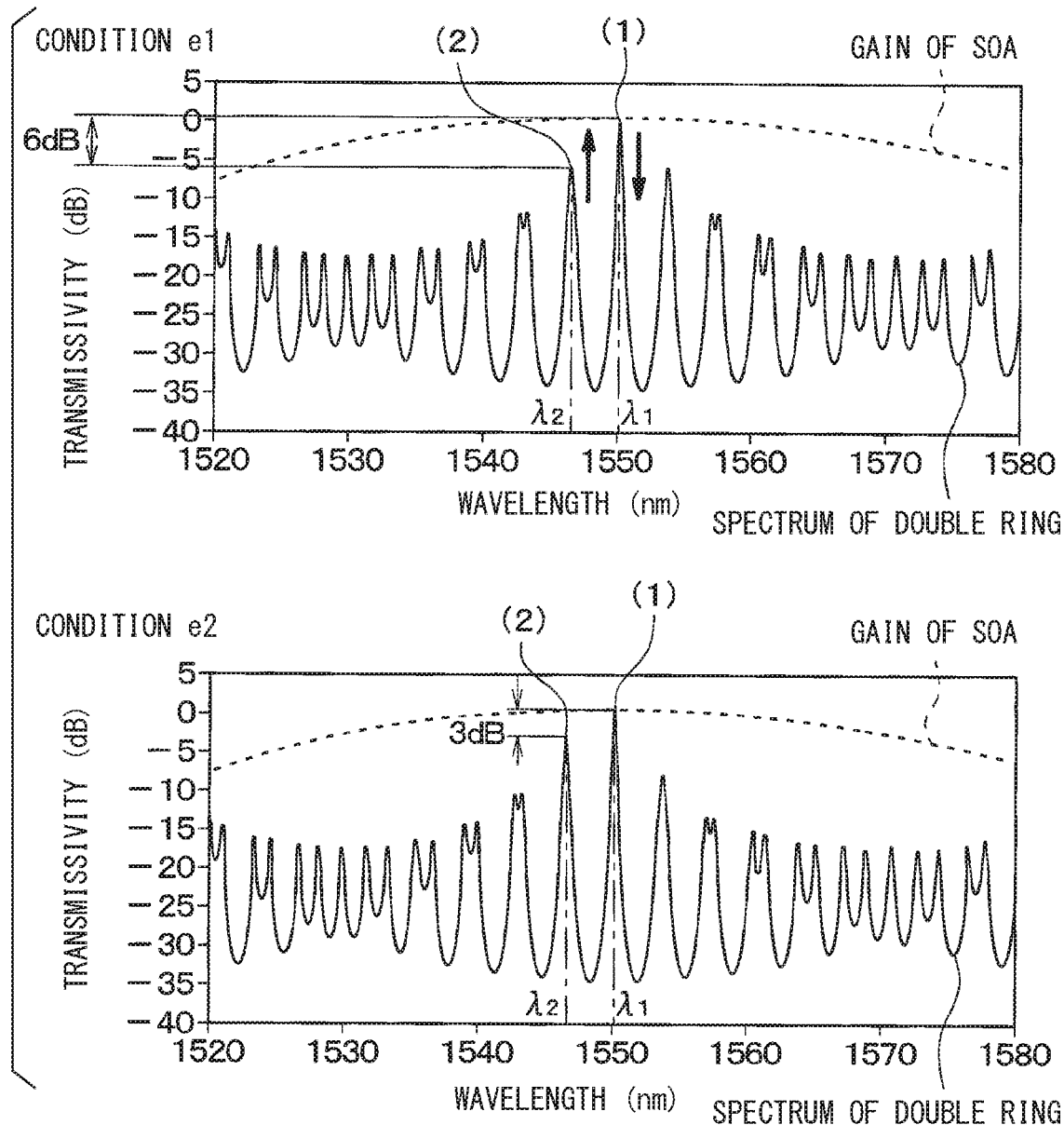
FIG. 19 is a waveform chart of a transmission spectrum of a double ring in each of the conditions e1 to e2.

As illustrated in FIG. 18B, a peak change in the transmission spectrum of the double ring was checked by a simulation for conditions e1 and e2 in such a laser light source. A peak height changed as shown in FIG. 18B. FIG. 19 shows the transmission spectrum of the double ring in each condition.

First, the condition e1 shows the transmission spectrum of the double ring when the relative temperature of the first ring resonator 13 relative to the temperature of the second ring resonator 15 is 0° C. In this case, a peak (1) near a wavelength of 1550 nm was the first peak, and a peak (2) near a wavelength of 1545 nm was the second peak. A wavelength range of the peak (1) is a wavelength range where the peak of the transmission spectrum of the first ring resonator 13 and the peak of the transmission spectrum of the second ring resonator 15 overlap. A wavelength range of the peak (2) is a place to be an adjacent peak where the peak of the transmission spectrum of the first ring resonator 13 and the peak of the transmission spectrum of the second ring resonator 15 do not overlap, and originally assumed to have the second peak. In this manner, the first peak was obtained in the wavelength range intended to have the first peak, and the second peak was obtained in the wavelength range intended to have the second peak. At this time, a transmissivity difference Y between the first peak and the second peak in the transmission spectrum of the double ring was 6.0 dB.

In the gain of the SOA 2 in the condition e1, a gain difference X between a wavelength λ1 having the first peak and a wavelength λ2 having the second peak was 0.0 dB. A value X+Y obtained by adding the gain difference X and the transmissivity difference Y between the wavelength λ1 having the first peak and the wavelength λ2 having the second peak was 6.0 dB. When 6.0 dB may be secured as the value X+Y which is the sum of the gain difference X and the transmissivity difference Y in this manner, one of the longitudinal modes of the Fabry-Perot resonator may be extracted by a double ring filter in which two ring resonators are connected in series to cause single-mode oscillation.

Next, the condition e2 shows the transmission spectrum of the double ring when the relative temperature of the first ring resonator 13 relative to the temperature of the second ring resonator 15 is 1.2° C. In this case, the peak (1) near a wavelength of 1550 nm was the first peak, and the peak (2) near a wavelength of 1545 nm was the second peak. The height of the second peak was substantially equal to the height of the first peak. In this manner, although the first peak was obtained in the wavelength range intended to have the first peak, the peak in the wavelength range intended to have the second peak had a height substantially equal to the first peak. At this time, the transmissivity difference Y between the first peak and the second peak in the transmission spectrum of the double ring was 3.0 dB.

In order to achieve single-mode oscillation, it is required that the value X+Y be 3.0 dB or higher, and it may be considered that single-mode oscillation may be achieved until the condition e2. The temperature difference between the first ring resonator 13 and the second ring resonator 15 at this time is 1.2° C. and thus small, and single-mode oscillation cannot be achieved if the temperature difference further increases. Single-mode oscillation may be achieved only when the temperature difference between the first ring resonator 13 and the second ring resonator 15 is small, for example, approximately 1° C., and thus it may be said that it is difficult to prevent a mode hop.

In the laser light source of such a comparative example, design is performed in such a manner that the transmissivity difference between the peak (1) and the peak (2) is 3 dB or more so as to prevent oscillation from occurring at the second peak or the like. The laser light source that performs single-mode oscillation may be achieved by designing both the transmissivity difference between the first peak and the second peak in the transmission spectrum of the double ring and the gain difference of the SOA 2. When the transmissivity difference between the peak (1) and the peak (2) is reduced due to the temperature difference between the first ring resonator 13 and the second ring resonator 15, single-mode oscillation cannot be achieved. It is not possible to prevent a mode hop.

Second Embodiment

A second embodiment is described in the following. The present embodiment differs from the first embodiment in a light extraction direction and the like. The other configurations are similar to those of the first embodiment. Only a part different from the first embodiment is described.

In the first embodiment, light is output from the reflecting mirror 21 corresponding to the first reflector when laser oscillation occurs. In the present embodiment, light is output from a part different from the reflecting mirror 21.

Figure 20:
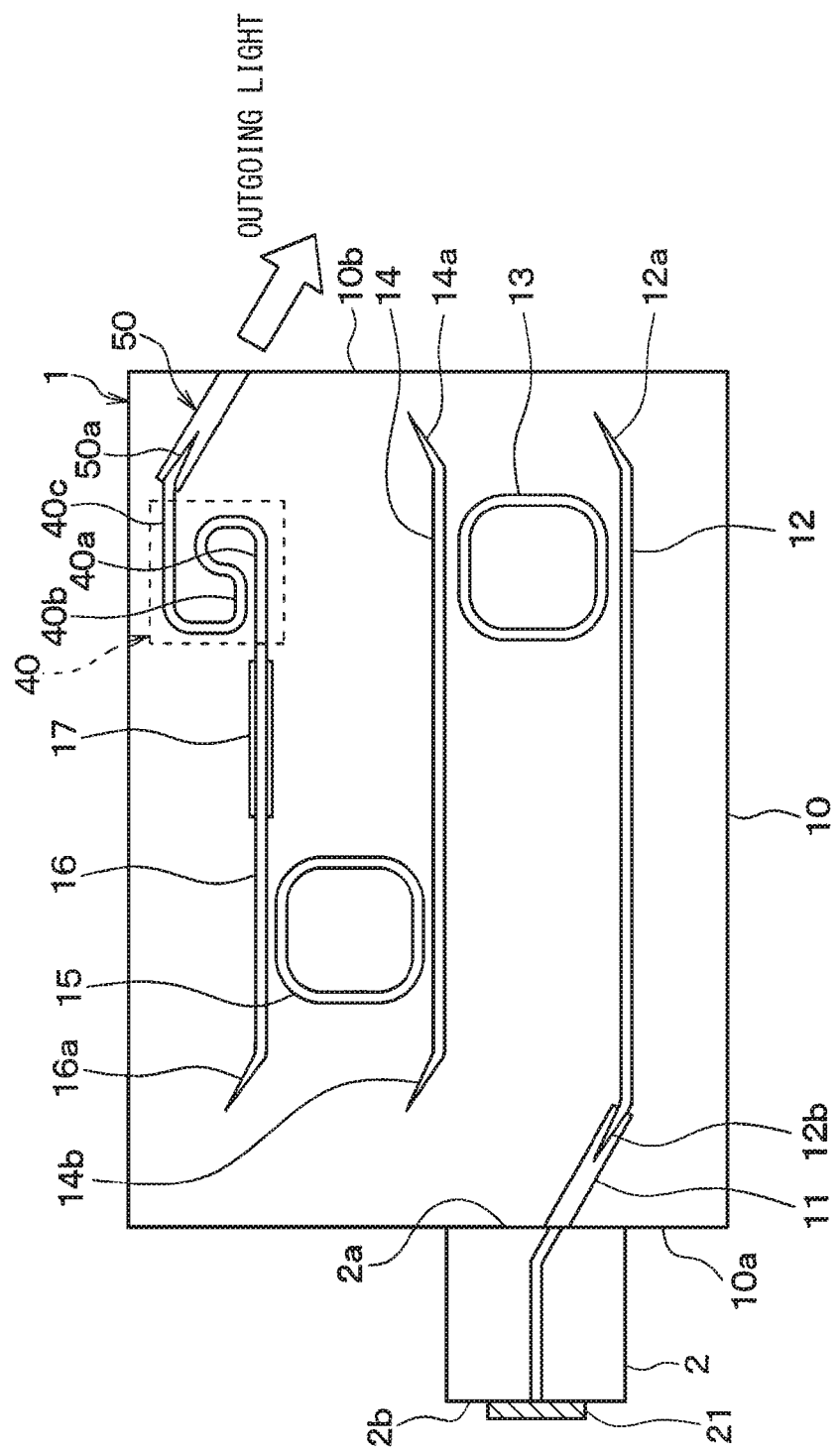
FIG. 20 is a diagram illustrating a schematic configuration of a laser light source according to a second embodiment.

In the present embodiment, the second reflector is not the loop mirror 18 as with the first embodiment, but a directional coupler 40 as illustrated in FIG. 20. The directional coupler 40 is folded back in a meandering manner from a third waveguide 16. In the present embodiment, the tip of the directional coupler 40 is directed to an end face 10b of a semiconductor substrate 10, the end face 10b being opposite to an end face 10a on which a SOA 2 is disposed.

Specifically, the directional coupler 40 includes a first folded-back part 40a, a second folded-back part 40b, and a third folded-back part 40c. The first folded-back part 40a is connected to one end of the third waveguide 16. In the present embodiment, the first folded-back part 40a extends on an extension line of the third waveguide 16. The second folded-back part 40b is folded back from the first folded-back part 40a toward the third waveguide 16. In the present embodiment, the second folded-back part 40b is folded back from an end of the first folded-back part 40a at a predetermined radius of curvature and brought closer to the first folded-back part 40a. A part of the second folded-back part 40b is opposed to the first folded-back part 40a. A predetermined gap is set between the part of the second folded-back part 40b and the first folded-back part 40a in the opposed part so that the second folded-back part 40b and the first folded-back part 40a are optically coupled to each other, and light transmitted to the second folded-back part 40b is transmitted to the first folded-back part 40a. The third folded-back part 40c is folded back from the second folded-back part 40b toward the end face 10b.

With such a configuration, the directional coupler 40 serves as the second reflector that reflects light transmitted to the directional coupler 40 from the third waveguide 16 so as to return the light to the third waveguide 16. Since the directional coupler 40 serves as the second reflector, a Fabry-Perot resonator in which internal outgoing light is reflected between the reflecting mirror 21 and the directional coupler 40 is constituted. During oscillation, strong light is output toward the end face 10a through the third folded-back part 40c of the directional coupler 40.

When the directional coupler 40 has a mode that extracts external outgoing light to the outside while reflecting internal outgoing light, the reflectivity of the directional coupler 40 is typically approximately 1 to 10%. The reflecting mirror 21 has a mode that reflects internal outgoing light, but does not extract external outgoing light to the outside. The reflectivity of the directional coupler 40 is approximately 90 to 100%.

An SSC 50 which includes a waveguide 50a having a tapered shape is connected to the tip of the third folded-back part 40c so that light is efficiently transmitted from the directional coupler 40 toward the SSC 50 by reducing reflection. The SSC 50 reaches the end face 10b so that light transmitted to the SSC 50 is output from the end face 10b.

Figure 21:
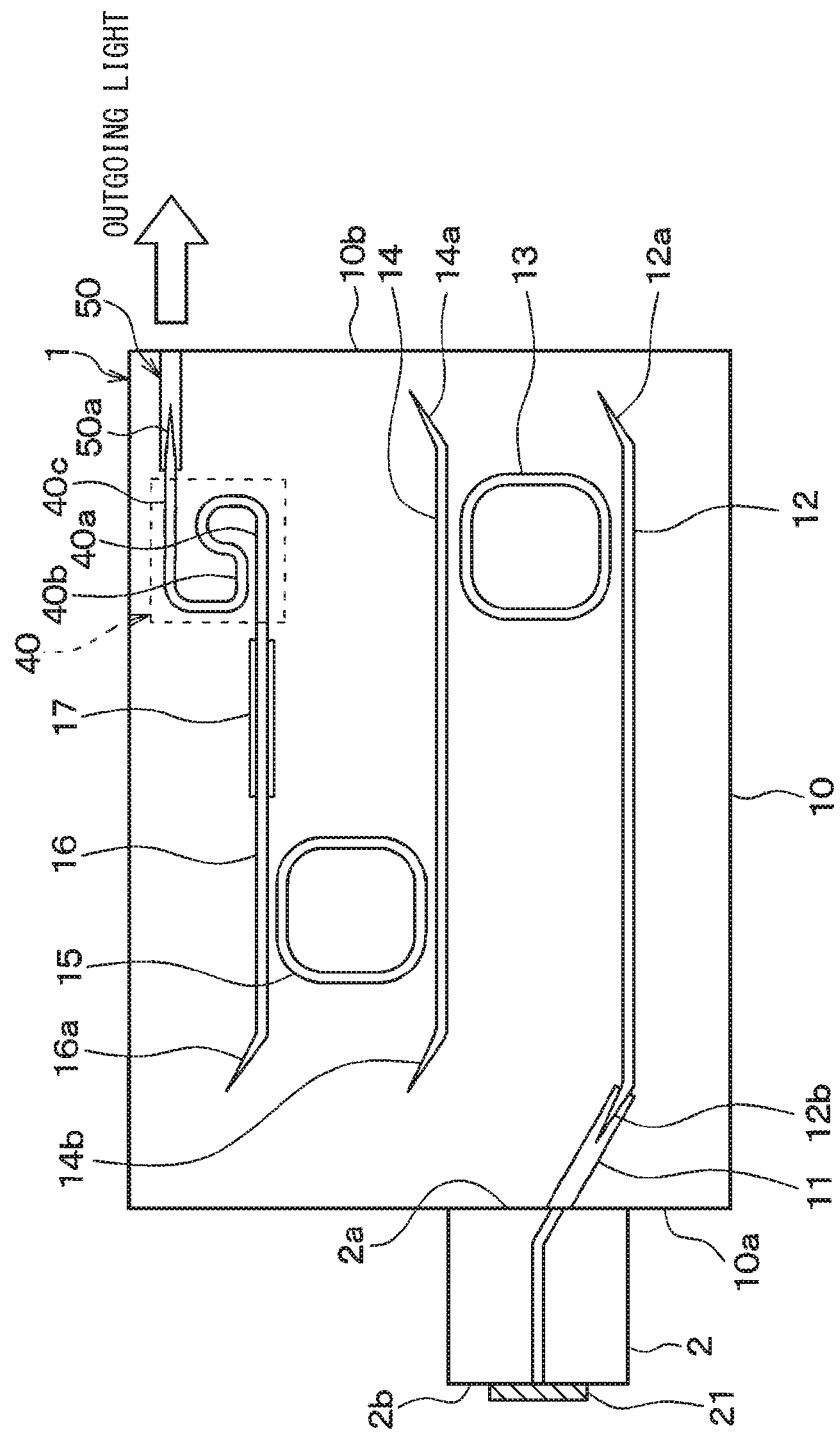
FIG. 21 is a diagram illustrating a schematic configuration of a laser light source according to a modification of the second embodiment.

In the present embodiment, the SSC 50 including the waveguide 50a extends in a direction inclined by a predetermined angle with respect to the longitudinal direction of the third folded-back part 40c. As illustrated in FIG. 21, the SSC 50 may extend in the same direction as the longitudinal direction of the third folded-back part 40c.

As described above, in the present embodiment, light is output from a part different from the reflecting mirror 21 corresponding to the first reflector, specifically, from the directional coupler 40 corresponding to the second reflector. In such a configuration, in a manner similar to the first embodiment, a transmission spectrum having a predetermined FSR is generated in each of a first ring resonator 13 and a second ring resonator 15 so that the highest first peak of the transmission spectrum of the double ring and the second highest second peak of the transmission spectrum of the double ring are not adjacent to each other. Accordingly, it is possible to obtain effects similar to the effects of the first embodiment.

Third Embodiment

A third embodiment is described in the following. The present embodiment differs from the first and second embodiments in a configuration between a first ring resonator 13 and a second ring resonator 15. The other configurations are similar to those of the first and second embodiments. Only a part different from the first and second embodiments is described. In the present embodiment, description is made with an example in which light is output through a reflecting mirror 21 of a SOA 2 as with the first embodiment. Light may be output from a part different from the reflecting mirror 21 as with the second embodiment.

Figure 22:
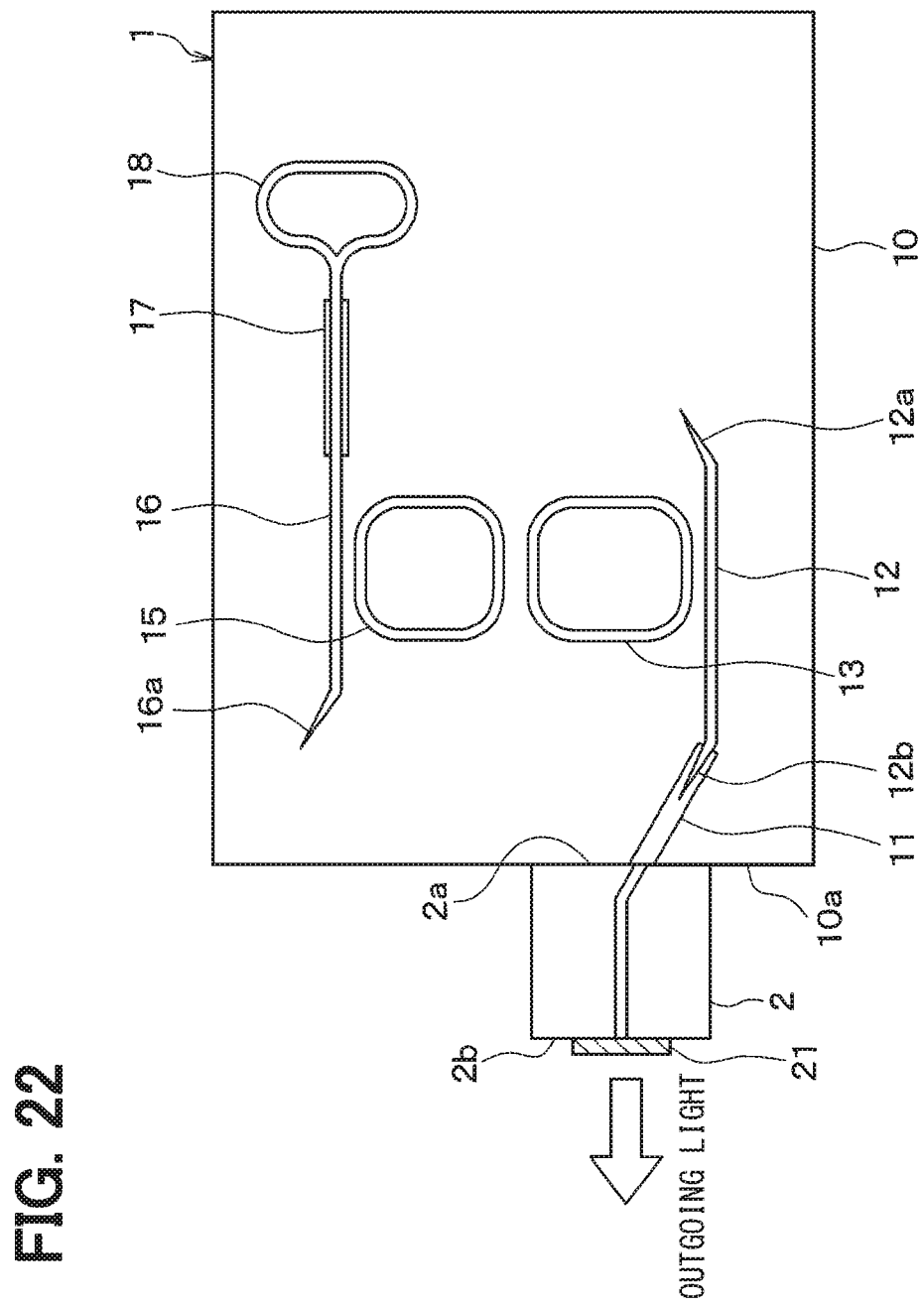
FIG. 22 is a diagram illustrating a schematic configuration of a laser light source according to a third embodiment.

In the present embodiment, the second waveguide 14 which is included in the first and second embodiments is eliminated. Specifically, as illustrated in FIG. 22, the first ring resonator 13 and the second ring resonator 15 are adjacent to each other. One side of the first ring resonator 13 and one side of the second ring resonator 15 are opposed to each other with a predetermined gap. Accordingly, the first ring resonator 13 and the second ring resonator 15 are directly optically coupled to each other so that light is transmitted between the first ring resonator 13 and the second ring resonator 15.

In this manner, the first ring resonator 13 and the second ring resonator 15 may be adjacently disposed so as to be directly optically coupled to each other so that light is transmitted between the first ring resonator 13 and the second ring resonator 15. Effects similar to the effects of the first embodiment may be obtained also with such a configuration.

Fourth Embodiment

A fourth embodiment is described in the following. The present embodiment differs from the first embodiment in that light transmitted to a third waveguide 16 is transmitted to a first waveguide 12 and reaches a reflecting mirror 21. The other configurations are similar to those of the first embodiment. Only a part different from the first embodiment is described.

Figure 23:
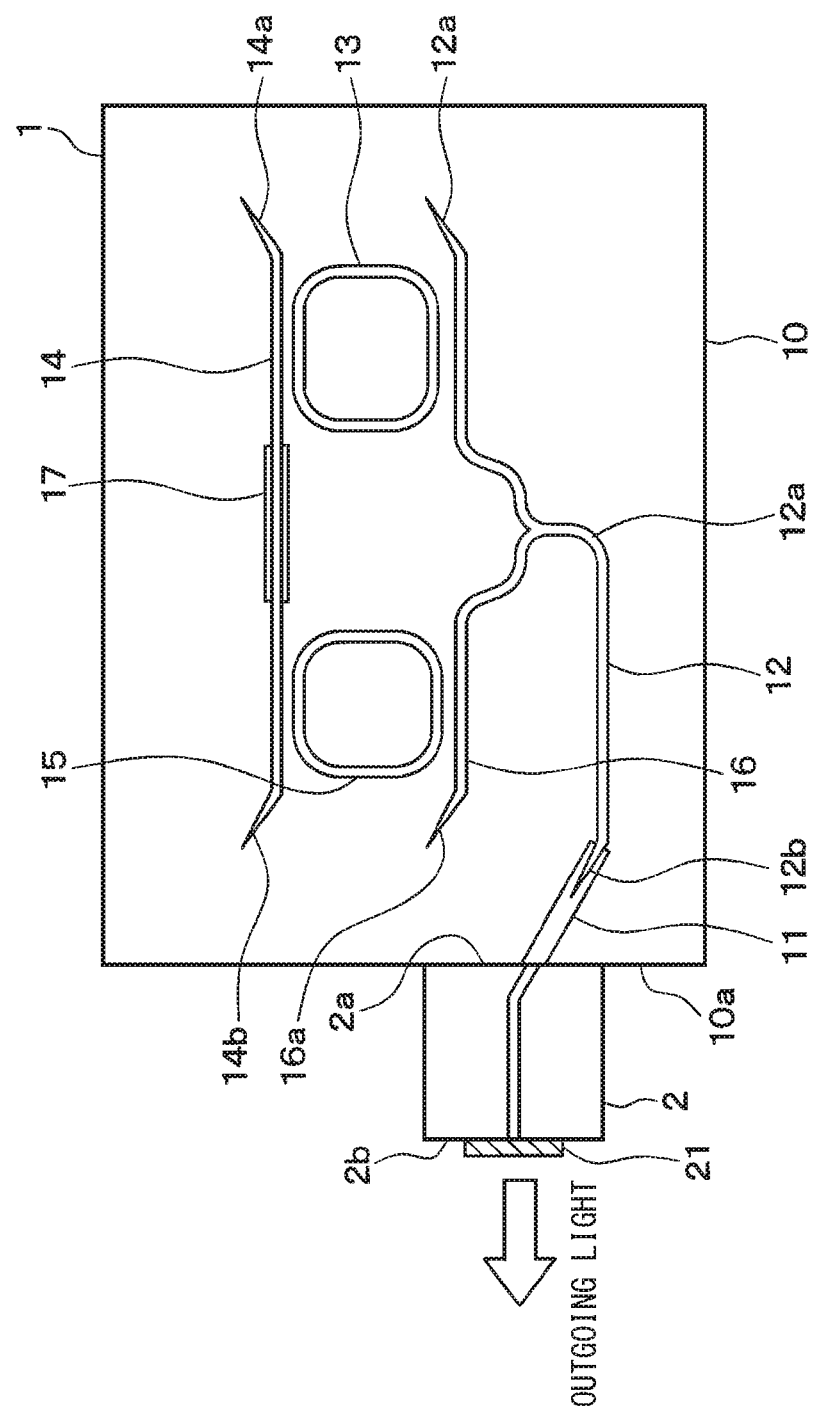
FIG. 23 is a diagram illustrating a schematic configuration of a laser light source according to a fourth embodiment.

As illustrated in FIG. 23, the first waveguide 12 has a shape bent at plural positions. A second ring resonator 15 is disposed on the same side as a first ring resonator 13 with respect to a second waveguide 14. The third waveguide 16 is disposed on the same side as the first waveguide 12 with respect to the second waveguide 14 with the second ring resonator 15 interposed between the second waveguide 14 and the third waveguide 16. The third waveguide 16 is connected to the first waveguide 12 so that the first waveguide 12 and the third waveguide 16 are included in a Y branch waveguide. A coupling length between the first ring resonator 13 and the first waveguide 12 or the second waveguide 14 and a coupling length between the second ring resonator 15 and the second waveguide 14 or the third waveguide 16 are set to different lengths so that the coupling efficiencies κ thereof have different values.

In the laser light source configured in this manner, internal outgoing light output from a SOA 2 is transmitted to the second waveguide 14 through the first waveguide 12 and the first ring resonator 13, and further transmitted from the second waveguide 14 to the third waveguide 16 through the second ring resonator 15. Then, the light transmitted to the third waveguide 16 is further transmitted to the first waveguide 12, and returned to the SOA 2 through the SSC 11. Accordingly, the light introduced into the first waveguide 12 is transmitted in an optical path in which the light is transmitted to the first ring resonator 13, the second waveguide 14, the second ring resonator 15, and the third waveguide 16, and reflected by the reflecting mirror 21. At the same time, the light introduced into the first waveguide 12 is transmitted to the third waveguide 16, the second ring resonator 15, the second waveguide 14, the first ring resonator 13, and the first waveguide 12, and returned to the SOA 2 through the SSC 11. Accordingly, the light introduced into the first waveguide 12 is also transmitted in an optical path in which the light is transmitted to the third waveguide 16, the second ring resonator 15, the second waveguide 14, the first ring resonator 13, and the first waveguide 12, and reflected by the reflecting mirror 21. Accordingly, a Fabry-Perot resonator including an optical path which branches in two directions in the Y branch waveguide is configured.

Also in such a configuration, a transmission spectrum having a predetermined FSR is generated in each of the first ring resonator 13 and the second ring resonator 15 so that the highest first peak of the transmission spectrum of the double ring and the second highest second peak of the transmission spectrum of the double ring are not adjacent to each other. The laser light source of the present embodiment can also obtain effects similar to the effects of the first embodiment.

In the present embodiment, the optical filter 1 includes the optical path. Light travels back and forth in the SSC 11 and the first waveguide 12 up to the branch point to the third waveguide 16. Light does not travel back and forth in the other part. In the present embodiment, the optical path included in the Fabry-Perot resonator is shorter than the optical path in which light travels back and forth in the first waveguide 12, the first ring resonator 13, the second waveguide 14, the second ring resonator 15, and the third waveguide 16 as with the first embodiment. The length of the first waveguide 12 may be adjusted depending on a required optical path length.

Fifth Embodiment

A fifth embodiment is described in the following. The present embodiment differs from the first, third, and fourth embodiments in that external outgoing light is extracted from a part other than a reflecting mirror 21. The other configurations are similar to those of the first, third, and fourth embodiments. Only a part different from the first, third, and fourth embodiments is described. Here, a case where an external outgoing light extraction structure of the present embodiment is applied to the structure of the first embodiment is described. The external outgoing light extraction structure can also be applied to the structures of the third and fourth embodiments.

Figure 24:
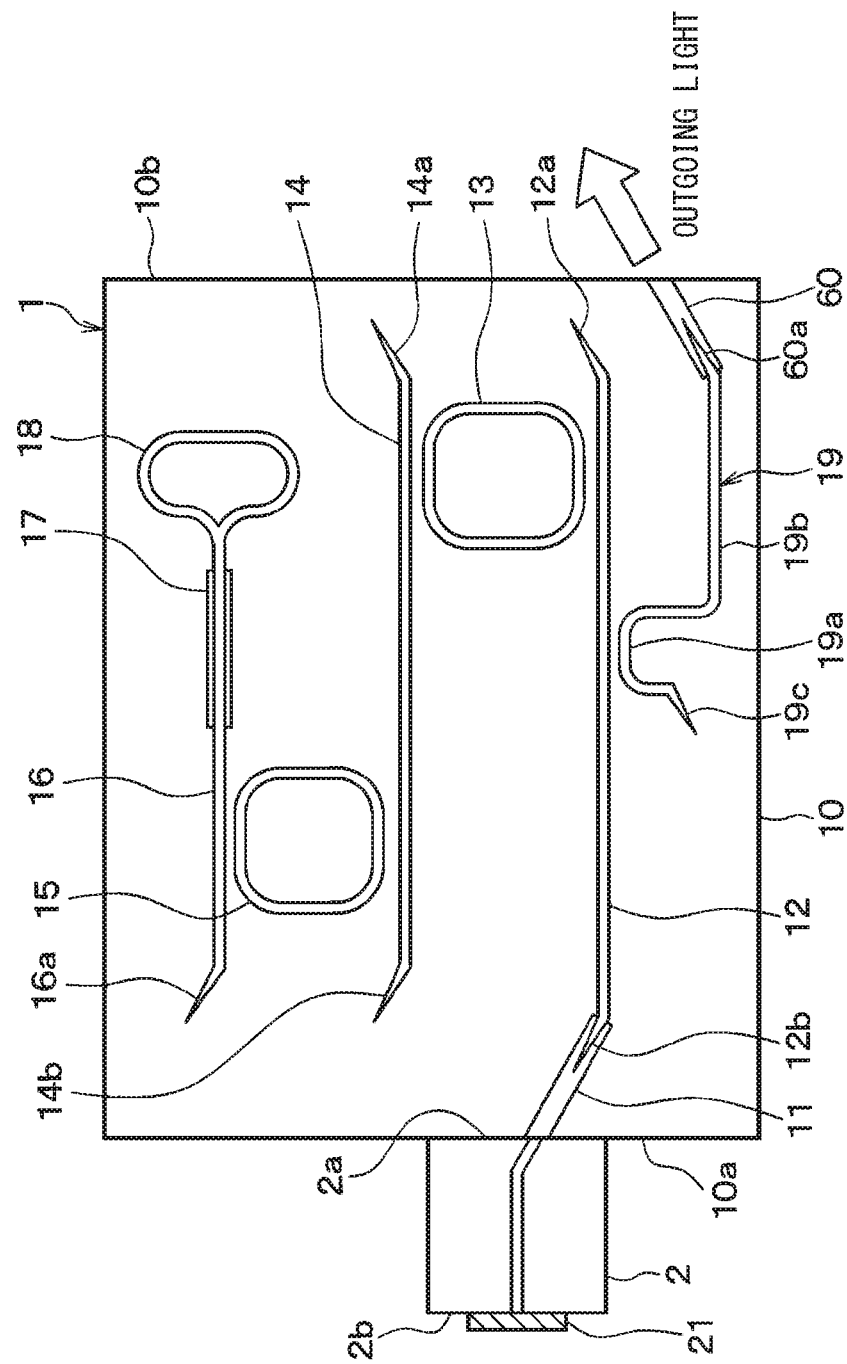
FIG. 24 is a diagram illustrating a schematic configuration of a laser light source according to a fifth embodiment.

As illustrated in FIG. 24, a fourth waveguide 19 corresponding to an emission waveguide is optically coupled to a first waveguide 12 so that external outgoing light is extracted through the fourth waveguide 19. Specifically, the fourth waveguide 19 includes an optical coupling part 19a, a linear part 19b, and a terminator 19c. The fourth waveguide 19 is optically coupled to the first waveguide 12 in the optical coupling part 19a. The linear part 19b extends in the same direction as the first waveguide 12. The fourth waveguide 19 is partially brought closer to the first waveguide 12 on one end side of the linear part 19b to configure the optical coupling part 19a. In the present embodiment, the optical coupling part 19a is disposed between the first ring resonator 13 and an SSC 11. A part of the fourth waveguide 19 is brought closer to the first waveguide 12 between the first ring resonator 13 and the SSC 11 to configure the optical coupling part 19a. The optical coupling part 19a includes a part opposed to the first waveguide 12 with a predetermined gap, and is optically coupled to the first waveguide 12 in the opposed part.

The terminator 19c is formed on an end of the fourth waveguide 19, the end being opposite to the side from which external outgoing light is extracted. The terminator 19c emits unnecessary light transmitted to the fourth waveguide 19 to the outside. In the present embodiment, the terminator 19c is connected to an end of the optical coupling part 19a, the end being opposite to the linear part 19b, and extends in a direction inclined by a predetermined angle with respect to the end of the optical coupling part 19a and the linear part 19b.

An SSC 60 which includes a waveguide 60a having a tapered shape is connected to the linear part 19b at the side opposite to the optical coupling part 19a and the terminator 19c. Light is efficiently transmitted from the fourth waveguide 19 toward the SSC 60 while reducing reflection. The SSC 60 reaches the end face 10b so that light transmitted to the SSC 60 is output from the end face 10b.

In the present embodiment, external outgoing light is extracted to the outside through the fourth waveguide 19 and the SSC 60. The reflecting mirror 21 corresponding to the first reflector and the loop mirror 18 corresponding to the second reflector have a mode that reflects internal outgoing light, but does not extract external outgoing light to the outside. The reflectivity of the reflecting mirror 21 and the loop mirror 18 is approximately 90 to 100%.

As described above, in the present embodiment, light is output from a part different from the reflecting mirror 21 corresponding to the first reflector, specifically, from the fourth waveguide 19 and the SSC 60. In such a configuration, in a manner similar to the first embodiment, a transmission spectrum having a predetermined FSR is generated in each of a first ring resonator 13 and a second ring resonator 15 so that the highest first peak of the transmission spectrum of the double ring and the second highest second peak thereof are not adjacent to each other. Accordingly, it is possible to obtain effects similar to the effects of the first embodiment.

Figure 25:
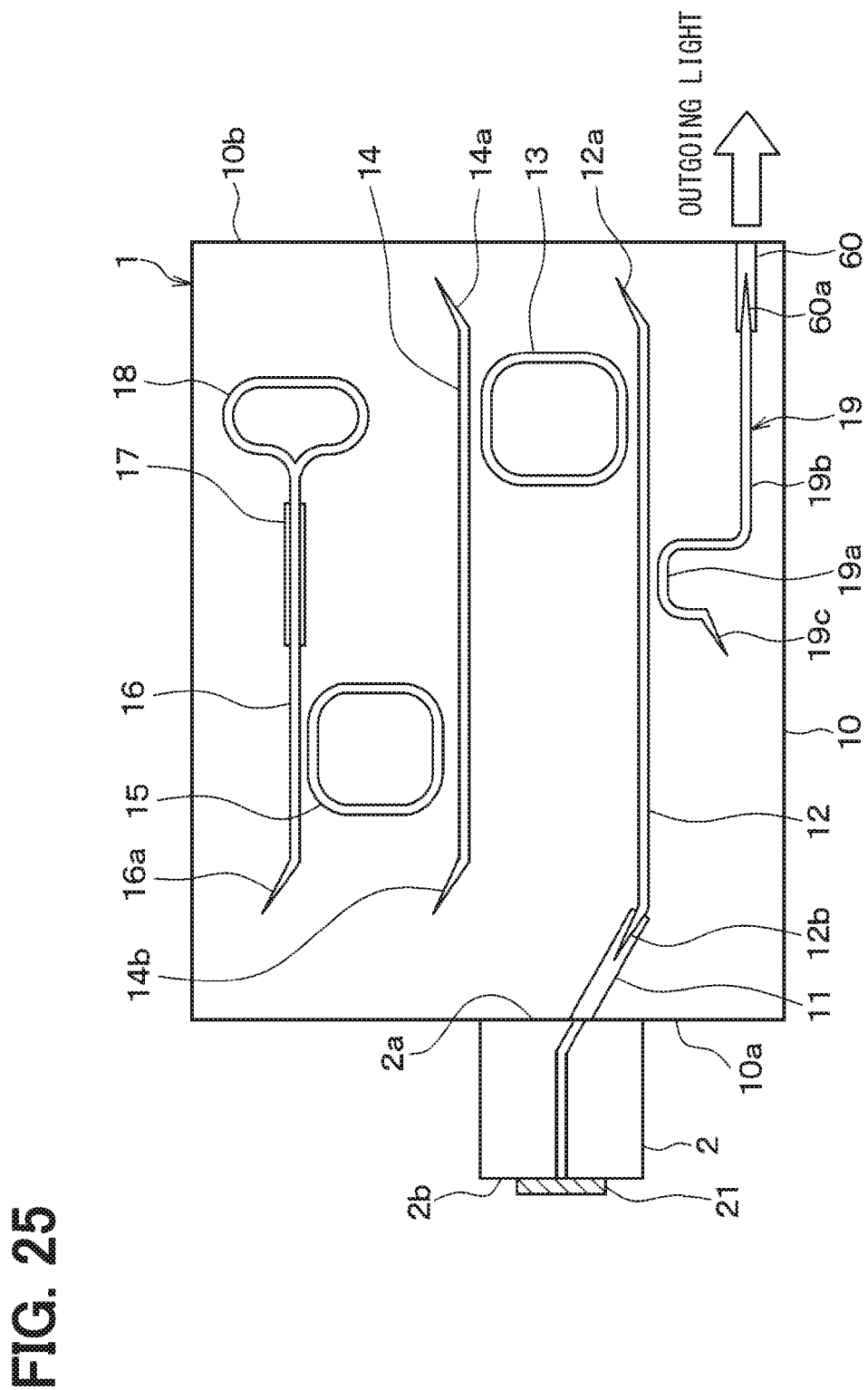
FIG. 25 is a diagram illustrating a schematic configuration of a laser light source according to a modification of the fifth embodiment.

In the present embodiment, the SSC 60 including the waveguide 60a extends in the direction inclined by a predetermined angle with respect to the longitudinal direction of the linear part 19b. As illustrated in FIG. 25, the SSC 60 may extend in the same direction as the longitudinal direction of the linear part 19b.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, in the above embodiments, the elements included in the embodiments are not necessarily essential unless otherwise particularly specified and unless the elements are considered to be obviously essential in principle. In each of the above embodiments, when a specific value of the elements, such as the number, numerical value, quantity, or range, is mentioned, the present disclosure is not limited to the specific value unless otherwise particularly specified as being essential and unless the present disclosure is obviously limited to the specific value in principle. In each of the above embodiments, when the shape of an element or the positional relationship between elements is mentioned, the present disclosure is not limited to the specific shape or positional relationship unless otherwise particularly specified and unless the present disclosure is limited to the specific shape or positional relationship in principle.

For example, the shapes of the first ring resonator 13, the second ring resonator 15, and the first to third waveguides 12, 14, 16 are not limited to the shapes described above. The material and the dimension such as the width of each part are not limited to the material and the dimension described above. The terminators 12a, 14a, 14b, 16a included in the first to third waveguides 12, 14, 16 are not essential, and the shapes of the terminators 12a, 14a, 14b, 16a are not limited to the shapes described above.

In the above embodiments, the peaks of the transmission spectrums of the first ring resonator 13 and the second ring resonator 15 overlap. The crests of the spectrums overlap at the wavelength of the first peak. A state in which the crests overlap does not mean that the peak heights and inclinations of the crests completely coincide with each other, but means that the wavelengths having the peaks of the crests substantially coincide with each other. The wavelengths do not have to completely coincide with each other, and may be slightly shifted from each other.

In each of the above examples, the perimeter Lring2 of the second ring resonator 15 is longer than the perimeter Lring1 of the first ring resonator 13. The magnitude relation may be inversed. In all the cases, it is better that between a combination of the perimeter Lring1 and the coupling efficiency κ1 and a combination of the perimeter Lring2 and the coupling efficiency κ2, the combination having the longer perimeter has a smaller coupling efficiency κ than the combination having the shorter perimeter. Therefore, it is possible to make the full width at half maximum of each transmission spectrum uniform and obtain the above effects.

The above second embodiment describes an example in which the directional coupler 40 is used as the second reflector capable of outputting light to the outside while reflecting internal outgoing light. The directional coupler 40 is merely an example of the second reflector, and the second reflector may include another reflecting structure such as a distributed Bragg reflector (DBR).

The first embodiment describes an example in which the loop mirror 18 is used as the second reflector that does not actively perform output of light to the outside. The loop mirror 18 is also merely an example of the second reflector. The second reflector may include the directional coupler 40 described in the second embodiment or the DBR. In the directional coupler 40, the coupling coefficient may be adjusted based on the opposed length and the gap between the first folded-back part 40a and the second folded-back part 40b, and phases of beams of light may be inverted to cause a π phase shift to cancel each other. The reflectivity may be adjusted within the range of 0 to 100%. Similarly, also in the DBR, the reflectivity may be adjusted within the range of 0 to 100% by adjusting the period and the number of diffraction gratings included in the DBR. The directional coupler 40 or the DBR may also be used as the second reflector that does not actively perform output of light to the outside by performing an adjustment for increasing the reflectivity.

In the fifth embodiment, the fourth waveguide 19, which extracts external outgoing light, is optically coupled to the first waveguide 12. The fourth waveguide 19 may be optically coupled not only to the first waveguide 12, but also to the second waveguide 14 or the third waveguide 16. The same may apply to the case where the structure for extracting light from the fourth waveguide 19 described in the fifth embodiment is applied to the third and fourth embodiments.

In each of the above embodiments, the first waveguide 12, the second waveguide 14, the third waveguide 16, and the fourth waveguide 19 have a linear shape. These waveguides do not necessarily have a linear shape. A part where each of the first ring resonator 13 and the second ring resonator 15 is optically coupled to each waveguide has a linear shape. The part also does not necessarily have a linear shape as long as optical coupling may be achieved.

What is claimed is:

1. An optical filter comprising:
a first ring resonator and a second ring resonator having different perimeters; and
a waveguide optically coupled to the first ring resonator and configured to transmit light to the first resonator, wherein:
the light incident on the waveguide is transmitted to the second ring resonator through the first ring resonator;
a free spectral range of a transmission spectrum of the first ring resonator and a free spectral range of a transmission spectrum of the second ring resonator are shifted to each other, and are set such that a transmission spectrum of a double ring, which corresponds to a synthetic spectrum of the transmission spectrum of the first ring resonator and the transmission spectrum of the second ring resonator, has a highest first peak at an arbitrary wavelength;
the transmission spectrum of the double ring has a second peak being second highest next to the first peak; and
the transmission spectrum of the double ring has a peak lower than the second peak, the peak located between the first peak and the second peak.

2. The optical filter according to claim 1, wherein:
the transmission spectrum of the double ring has a third peak being third highest next to the second peak; and
the third peak is located between the first peak and the second peak.

3. The optical filter according to claim 1, wherein:
the transmission spectrum of the double ring has the first peaks correspondingly at a plurality of wavelengths;
the transmission spectrum of the first ring resonator and the transmission spectrum of the second ring resonator are alternately present in a sequential order between the first peaks; and
the transmission spectrum of the first ring resonator and the transmission spectrum of the second ring resonator have an order reversing point where the sequential order is reversed.

4. The optical filter according to claim 1, wherein:
the transmission spectrum of the double ring has the first peaks correspondingly at a plurality of wavelengths;
a crest of the transmission spectrum of the first ring resonator and a crest of the transmission spectrum of the second ring resonator overlap at each of the first peaks in the wavelengths;
the second peak is located between the first peaks; and
a trough of the transmission spectrum of the first ring resonator and a trough of the transmission spectrum of the second ring resonator overlap at a point in a vicinity of the second peak.

5. The optical filter according to claim 1,
wherein the waveguide configured to transmit the light to the first ring resonator is defined as a first waveguide, the optical filter further comprising:
a second waveguide optically coupled to the first ring resonator and the second ring resonator, and configured to receive the light transmitted from the first ring resonator and transmit the light to the second ring resonator.

6. The optical filter according to claim 1,
wherein the first ring resonator and the second ring resonator are directly optically coupled to each other such that the light is directly transmitted from the first ring resonator to the second ring resonator.

7. The optical filter according to claim 1,
wherein the waveguide configured to transmit the light to the first ring resonator is defined as a first waveguide, the optical filter further comprising:
a second waveguide optically coupled to the first ring resonator and the second ring resonator, and configured to receive the light transmitted from the first ring resonator and transmit the light to the second ring resonator; and
a third waveguide optically coupled to the second ring resonator and connected to the first waveguide, a Y-branch waveguide including the third waveguide and the first waveguide.

8. A laser light source comprising:
the optical filter according to claim 5; and
a semiconductor optical amplifier connected to the optical filter and configured to input the light to the first waveguide,
wherein the semiconductor optical amplifier includes:
a first face connected to the optical filter;
a second face opposite to the first face in the semiconductor optical amplifier; and
a first reflector disposed on the second face and configured to reflect the light transmitted from the first waveguide to the semiconductor optical amplifier,
wherein the optical filter further includes:
a third waveguide optically coupled to the second ring resonator and configured to receive the light transmitted from the second ring resonator; and
a second reflector configured to reflect the light transmitted to the third waveguide such that the reflected light is transmitted to the third waveguide,
wherein a Fabry-Perot resonator is configured in which:
the light input to the first waveguide is transmitted to the first ring resonator, the second waveguide, the second ring resonator, and the third waveguide in order, and then reflected by the second reflector; and
the light reflected by the second reflector is transmitted to the third waveguide, the second ring resonator, the second waveguide, the first ring resonator, and the first waveguide in order, and then reflected by the first reflector, and wherein oscillation occurs at a wavelength corresponding to the first peak of the transmission spectrum of the double ring, and the light is emitted from one of the first reflector or the second reflector.

9. The laser light source according to claim 8,
wherein, on a combination of the perimeter of the first ring resonator and a coupling efficiency between the first ring resonator and the first waveguide and a combination of the perimeter of the second ring resonator and a coupling efficiency between the second ring resonator and the second waveguide, the coupling efficiency in the combination having a longer perimeter is smaller than the coupling efficiency in the combination having a shorter perimeter.

10. A laser light source comprising:
the optical filter according to claim 6; and
a semiconductor optical amplifier connected to the optical filter and configured to input the light to the waveguide, which is configured to transmit the light to the first ring resonator, the waveguide being defined as one waveguide,
wherein the semiconductor optical amplifier includes:
a first face connected to the optical filter;
a second face opposite to the first face; and
a first reflector disposed on the second face and configured to reflect the light transmitted from the one waveguide to the semiconductor optical amplifier,
wherein the optical filter further includes:
an additional one waveguide optically coupled to the second ring resonator and configured to receive the light transmitted from the second ring resonator; and
a second reflector configured to reflect the light transmitted to the additional waveguide such that the reflected light is transmitted to the additional waveguide,
wherein a Fabry-Perot resonator is configured in which:
the light input to the one waveguide is transmitted to the first ring resonator, the second ring resonator, and the additional one waveguide in order, and then reflected by the second reflector; and
the light reflected by the second reflector is transmitted to the additional one waveguide, the second ring resonator, the first ring resonator, and the one waveguide in order, and then reflected by the first reflector, and
oscillation occurs at a wavelength corresponding to the first peak of the transmission spectrum of the double ring, and the light is emitted from one the first reflector or the second reflector.

11. A laser light source comprising:
the optical filter according to claim 7; and
a semiconductor optical amplifier connected to the optical filter and configured to input the light to the first waveguide,
wherein the semiconductor optical amplifier includes:
a first face connected to the optical filter;
a second face opposite to the first face; and
a reflector disposed on the second face and configured to reflect the light transmitted from the first waveguide to the semiconductor optical amplifier,
wherein a Fabry-Perot resonator is configured to have an optical path branching into:
an optical path in which the light input to the first waveguide is transmitted to the first ring resonator, the second waveguide, the second ring resonator, and the third waveguide in order, and then reflected by the reflector; and
an optical path in which the light input to the first waveguide is transmitted to the third waveguide, the second ring resonator, the second waveguide, the first ring resonator, and the first waveguide in order and reflected by the reflector, and
wherein oscillation occurs at a wavelength corresponding to the first peak of the transmission spectrum of the double ring, and the light is emitted from the reflector.

12. A laser light source comprising:
the optical filter according to claim 5; and
a semiconductor optical amplifier connected to the optical filter and configured to input the light to the first waveguide,
wherein the semiconductor optical amplifier includes a first face connected to the optical filter and a second face opposite to the first face, and a first reflector disposed on the second face and configured to reflect the light transmitted from the first waveguide to the semiconductor optical amplifier,
wherein the optical filter includes:
a third waveguide optically coupled to the second ring resonator and configured to receive the light transmitted from the second ring resonator; and
a second reflector configured to reflect the light such that the reflected light is transmitted to the third waveguide,
wherein a Fabry-Perot resonator is configured in which:
the light input to the first waveguide is transmitted to the first ring resonator, the second waveguide, the second ring resonator, and the third waveguide in order, and then reflected by the second reflector; and
the light input to the first waveguide is transmitted to the third waveguide, the second ring resonator, the second waveguide, the first ring resonator, and the first waveguide in order, and then reflected by the first reflector,
wherein the optical filter further includes an emission waveguide optically coupled to one of the first waveguide, the second waveguide, or the third waveguide, and
wherein oscillation occurs at a wavelength corresponding to the first peak of the transmission spectrum of the double ring, and the light is emitted through the emission waveguide.

13. A laser light source comprising:
the optical filter according to claim 6; and
a semiconductor optical amplifier connected to the optical filter and configured to input the light to the waveguide configured to transmit the light to the first ring resonator, the waveguide being defined as one waveguide,
wherein the semiconductor optical amplifier includes:
a first face connected to the optical filter and a second face opposite to the first face, and
a first reflector disposed on the second face and configured to reflect the light transmitted from the one waveguide to the semiconductor optical amplifier,
wherein the optical filter includes:
an additional one waveguide optically coupled to the second ring resonator, and configured to receive the light transmitted from the second ring resonator; and
a second reflector configured to reflect the light such that the reflected light is transmitted to the additional waveguide,
wherein a Fabry-Perot resonator is configured in which:
the light input to the one waveguide is transmitted to the first ring resonator, the second ring resonator, and the additional one waveguide in order, and then reflected by the second reflector; and the light is transmitted to the additional one waveguide, the second ring resonator, the first ring resonator, and the one waveguide in order, and then reflected by the first reflector, wherein the optical filter further includes an emission waveguide optically coupled to one of the one waveguide or the additional one waveguide, and wherein oscillation occurs at a wavelength corresponding to the first peak of the transmission spectrum of the double ring, and the light is emitted through the emission waveguide.

14. A laser light source comprising:

the optical filter according to claim 7; and a semiconductor optical amplifier connected to the optical filter and configured to input the light to the first waveguide, wherein the semiconductor optical amplifier includes:

a first face connected to the optical filter and a second face opposite to the first face; and a reflector disposed on the second face and configured to reflect the light transmitted from the first waveguide to the semiconductor optical amplifier, wherein a Fabry-Perot resonator is configured to have an optical path branching into:

an optical path in which the light input to the first waveguide is transmitted to the first ring resonator, the second waveguide, the second ring resonator, and the third waveguide in order, and then reflected by the reflector, and an optical path in which the light input to the first waveguide is transmitted to the third waveguide, the second ring resonator, the second waveguide, the first ring resonator, and the first waveguide in order, and then reflected by the reflector, wherein the optical filter further includes an emission waveguide optically coupled to one of the first waveguide, the second waveguide, or the third waveguide, and wherein oscillation occurs at a wavelength corresponding to the first peak of the transmission spectrum of the double ring, and the light is emitted through the emission waveguide.

15. An optical transceiver comprising:

the laser light source according to claim 9, wherein the laser light source is used as a light source.

* * * * *